US008611062B2

(12) United States Patent
Bishop et al.

(10) Patent No.: US 8,611,062 B2
(45) Date of Patent: Dec. 17, 2013

(54) SURGE CURRENT SENSOR AND SURGE PROTECTION SYSTEM INCLUDING THE SAME

(75) Inventors: Roger Bishop, Dayton, NV (US); Chris Penwell, Minden, NV (US); Jonathan L. Jones, Carson City, NV (US)

(73) Assignee: Transtector Systems, Inc., Hayden, ID (US)

( * ) Notice: Subject to any disclaimer, the term of this patent is extended or adjusted under 35 U.S.C. 154(b) by 190 days.

(21) Appl. No.: 13/107,214

(22) Filed: May 13, 2011

(65) Prior Publication Data

US 2011/0279942 A1    Nov. 17, 2011

Related U.S. Application Data

(60) Provisional application No. 61/406,519, filed on Oct. 25, 2010, provisional application No. 61/334,943, filed on May 14, 2010, provisional application No. 61/334,509, filed on May 13, 2010.

(51) Int. Cl.
*H02H 9/02* (2006.01)

(52) U.S. Cl.
USPC ........................................................ 361/93.6

(58) Field of Classification Search
USPC ........................................................ 361/93.6
See application file for complete search history.

(56) References Cited

U.S. PATENT DOCUMENTS

| | | |
|---|---|---|
| 2,030,179 A | 2/1936 | Potter |
| 3,167,729 A | 1/1965 | Hall |
| 3,323,083 A | 5/1967 | Ziegler |
| 3,619,721 A | 11/1971 | Westendorp |
| 3,663,901 A | 5/1972 | Forney, Jr. |
| 3,731,234 A | 5/1973 | Collins |
| 3,750,053 A | 7/1973 | LeDonne |
| 3,783,178 A | 1/1974 | Philibert |
| 3,831,110 A | 8/1974 | Eastman |
| 3,845,358 A | 10/1974 | Anderson et al. |
| 3,944,937 A | 3/1976 | Fujisawa et al. |
| 3,980,976 A | 9/1976 | Tadama et al. |
| 4,046,451 A | 9/1977 | Juds et al. |

(Continued)

FOREIGN PATENT DOCUMENTS

| | | |
|---|---|---|
| CH | 675933 A5 | 11/1990 |
| JP | 08-066037 | 3/1996 |

(Continued)

OTHER PUBLICATIONS

PCT/US03/17050 ISR, May 30, 2003, PCT/WIPO.

*Primary Examiner* — Scott Bauer
(74) *Attorney, Agent, or Firm* — Snell & Wilmer LLP

(57) ABSTRACT

The present invention may provide a surge current sensor and a surge protection system that deploys one or more surge current sensors. The surge current sensor may be placed on or near to a conduit, and it may be used for sensing the surge current conducted therein. The surge current sensor may include a current transformer and a processor. The current transformer may be used for receiving a magnetic flux generated by the surge current and transforming the received magnetic flux to a voltage. The processor may be coupled with the current transformer, such that it may be configured to generate a digital signal based on the voltage. Once the digital signal indicates that the magnitude of the surge current has exceeded a predefined threshold, the surge protection system may initiate a surge protection mechanism.

19 Claims, 12 Drawing Sheets

(56) References Cited

U.S. PATENT DOCUMENTS

| | | |
|---|---|---|
| 4,047,120 A | 9/1977 | Lord et al. |
| 4,112,395 A | 9/1978 | Seward |
| 4,262,317 A | 4/1981 | Baumbach |
| 4,356,360 A | 10/1982 | Volz |
| 4,359,764 A | 11/1982 | Block |
| 4,384,331 A | 5/1983 | Fukuhara et al. |
| 4,409,637 A | 10/1983 | Block |
| 4,481,641 A | 11/1984 | Gable et al. |
| 4,554,608 A | 11/1985 | Block |
| 4,563,720 A | 1/1986 | Clark |
| 4,586,104 A | 4/1986 | Standler |
| 4,689,713 A | 8/1987 | Hourtane et al. |
| 4,698,721 A | 10/1987 | Warren |
| 4,727,350 A | 2/1988 | Ohkubo |
| 4,952,173 A | 8/1990 | Peronnet et al. |
| 4,984,146 A | 1/1991 | Black et al. |
| 4,985,800 A | 1/1991 | Feldman et al. |
| 5,053,910 A | 10/1991 | Goldstein |
| 5,057,964 A | 10/1991 | Bender et al. |
| 5,102,818 A | 4/1992 | Paschke et al. |
| 5,122,921 A | 6/1992 | Koss |
| 5,124,873 A | 6/1992 | Wheeler et al. |
| 5,142,429 A | 8/1992 | Jaki |
| 5,166,855 A | 11/1992 | Turner |
| 5,170,151 A | 12/1992 | Hochstein |
| 5,278,720 A | 1/1994 | Bird |
| 5,321,573 A | 6/1994 | Person et al. |
| 5,353,189 A | 10/1994 | Tomlinson |
| 5,412,526 A | 5/1995 | Kapp et al. |
| 5,442,330 A | 8/1995 | Fuller et al. |
| 5,537,044 A | 7/1996 | Stahl |
| 5,611,224 A | 3/1997 | Weinerman et al. |
| 5,617,284 A | 4/1997 | Paradise |
| 5,625,521 A | 4/1997 | Luu |
| 5,667,298 A | 9/1997 | Musil et al. |
| 5,721,662 A | 2/1998 | Glaser et al. |
| 5,781,844 A | 7/1998 | Spriester et al. |
| 5,790,361 A | 8/1998 | Minich |
| 5,798,790 A * | 8/1998 | Knox et al. .................. 348/191 |
| 5,844,766 A | 12/1998 | Miglioli et al. |
| 5,854,730 A | 12/1998 | Mitchell et al. |
| 5,953,195 A | 9/1999 | Pagliuca |
| 5,966,283 A | 10/1999 | Glaser et al. |
| 5,982,602 A | 11/1999 | Tellas et al. |
| 5,986,869 A | 11/1999 | Akdag |
| 6,054,905 A | 4/2000 | Gresko |
| 6,060,182 A | 5/2000 | Tanaka et al. |
| 6,061,223 A | 5/2000 | Jones et al. |
| 6,086,544 A | 7/2000 | Hibner et al. |
| 6,115,227 A | 9/2000 | Jones et al. |
| 6,137,352 A | 10/2000 | Germann |
| 6,141,194 A | 10/2000 | Maier |
| 6,177,849 B1 | 1/2001 | Barsellotti et al. |
| 6,226,166 B1 | 5/2001 | Gumley et al. |
| 6,236,551 B1 | 5/2001 | Jones et al. |
| 6,243,247 B1 | 6/2001 | Akdag et al. |
| 6,252,755 B1 | 6/2001 | Willer |
| 6,281,690 B1 | 8/2001 | Frey |
| 6,292,344 B1 | 9/2001 | Glaser et al. |
| 6,342,998 B1 | 1/2002 | Bencivenga et al. |
| 6,381,283 B1 | 4/2002 | Bhardwaj et al. |
| 6,385,030 B1 | 5/2002 | Beene |
| 6,394,122 B1 | 5/2002 | Sibley et al. |
| 6,421,220 B2 | 7/2002 | Kobsa |
| 6,502,599 B1 | 1/2003 | Sibley et al. |
| 6,527,004 B1 | 3/2003 | Sibley et al. |
| 6,535,369 B1 | 3/2003 | Redding et al. |
| 6,650,203 B2 | 11/2003 | Gerstenberg et al. |
| 6,721,155 B2 | 4/2004 | Ryman |
| 6,754,060 B2 | 6/2004 | Kauffman |
| 6,757,152 B2 | 6/2004 | Galvagni et al. |
| 6,782,329 B2 * | 8/2004 | Scott .............................. 702/58 |
| 6,785,110 B2 | 8/2004 | Bartel et al. |
| 6,789,560 B1 | 9/2004 | Stoner et al. |
| 6,814,100 B1 | 11/2004 | Sibley et al. |
| 6,816,348 B2 | 11/2004 | Chen et al. |
| 6,968,852 B1 | 11/2005 | Sibley |
| 6,975,496 B2 | 12/2005 | Jones et al. |
| 7,082,022 B2 | 7/2006 | Bishop |
| 7,092,230 B2 | 8/2006 | Inauen |
| 7,104,282 B2 | 9/2006 | Hooker et al. |
| 7,106,572 B1 | 9/2006 | Girard |
| 7,130,103 B2 | 10/2006 | Murata |
| 7,159,236 B2 | 1/2007 | Abe et al. |
| 7,221,550 B2 | 5/2007 | Chang et al. |
| 7,250,829 B2 | 7/2007 | Namura |
| 7,338,547 B2 | 3/2008 | Johnson et al. |
| 7,371,970 B2 | 5/2008 | Flammer et al. |
| 7,430,103 B2 | 9/2008 | Kato |
| 7,453,268 B2 | 11/2008 | Lin |
| 7,471,172 B2 | 12/2008 | Holst et al. |
| 7,507,105 B1 | 3/2009 | Peters et al. |
| 7,623,332 B2 | 11/2009 | Frank et al. |
| 7,808,752 B2 | 10/2010 | Richiuso et al. |
| 7,817,398 B1 | 10/2010 | Maples |
| 2002/0167302 A1 | 11/2002 | Gallavan |
| 2002/0191360 A1 | 12/2002 | Colombo et al. |
| 2003/0072121 A1 | 4/2003 | Bartel et al. |
| 2003/0211782 A1 | 11/2003 | Esparaz et al. |
| 2004/0042149 A1 | 3/2004 | Devine et al. |
| 2004/0121648 A1 | 6/2004 | Voros |
| 2004/0145849 A1 | 7/2004 | Chang et al. |
| 2004/0264087 A1 | 12/2004 | Bishop |
| 2005/0036262 A1 | 2/2005 | Siebenthall et al. |
| 2005/0044858 A1 | 3/2005 | Hooker et al. |
| 2005/0176275 A1 | 8/2005 | Hoopes et al. |
| 2005/0185354 A1 | 8/2005 | Hoopes |
| 2006/0038635 A1 | 2/2006 | Richiouso et al. |
| 2006/0120005 A1 | 6/2006 | Van Sickle |
| 2006/0139832 A1 | 6/2006 | Yates et al. |
| 2006/0146458 A1 | 7/2006 | Mueller |
| 2007/0053130 A1 | 3/2007 | Harwath |
| 2007/0095400 A1 * | 5/2007 | Bergquist et al. ............. 137/485 |
| 2007/0097583 A1 | 5/2007 | Harwath |
| 2007/0139850 A1 | 6/2007 | Kamel et al. |
| 2009/0103226 A1 | 4/2009 | Penwell et al. |
| 2009/0109584 A1 | 4/2009 | Jones et al. |
| 2009/0284888 A1 | 11/2009 | Bartel et al. |
| 2009/0296430 A1 | 12/2009 | Rieux-Lopez et al. |
| 2011/0080683 A1 | 4/2011 | Jones et al. |
| 2011/0141646 A1 | 6/2011 | Jones et al. |
| 2011/0159727 A1 | 6/2011 | Howard et al. |

FOREIGN PATENT DOCUMENTS

| | | |
|---|---|---|
| JP | 11-037400 | 2/1999 |
| JP | 2003-070156 | 3/2003 |
| JP | 2003-111270 | 4/2003 |
| KR | 10-2003-0081041 | 10/2003 |
| KR | 1020090018497 | 2/2009 |
| WO | WO 9510116 | 4/1995 |
| WO | WO 2011-119723 | 12/2011 |

* cited by examiner

SURGE CURRENT SENSOR AND SURGE PROTECTION SYSTEM INCLUDING THE SAME

CROSS REFERENCE TO RELATED APPLICATIONS

This application claims priority to and the benefit of U.S. Provisional Application No. 61/406,519, entitled "LIGHTNING DISCHARGE DISTURBANCE SENSE APPARATUS," filed on Oct. 25, 2010, U.S. Provisional Application No. 61/334,943, entitled "LIGHTNING DISCHARGE DISTURBANCE SENSE APPARATUS," filed on May 14, 2010, and U.S. Provisional Application No. 61/334,509, entitled "LIGHTNING DISCHARGE DISTURBANCE SENSE APPARATUS," filed on May 13, 2010. Each of the aforementioned U.S. Provisional applications is assigned to the assignee hereof and hereby expressly incorporated by reference herein.

BACKGROUND

1. Field

The present invention generally relates to the field of surge protection devices, and more particularly to surge current sensors and surge protection system including the same.

2. Description of the Related Art

A surge protector (or surge suppressor) is an apparatus or an appliance designed to protect electrical devices from electrical surges. A surge protector may limit the voltage supplied to an electric device by either blocking or by shorting to ground any unwanted voltages above a safe threshold. The terms surge protection device may be used to describe electrical devices typically installed in power distribution panels, process control systems, communications systems, and other heavy-duty industrial systems, for the purpose of protecting against electrical surges, including those caused by lightning. Scaled-down versions of these devices are sometimes installed in residential service entrance electrical panels (bulkhead panels) to protect equipment in a household from similar hazards.

Conventional surge protection devices focus on the voltage suppression aspect of surge protection, with an emphasis on protecting the electrical devices. However, conventional surge protection devices typically have a slow response time, and they are not designed for protecting metallic conduits. In the case of proximity lightning, high voltage can be induced in the metallic conduit in a relatively short period of time. The high voltage may cause arcing within the metallic conduit. Because of their relatively slow response time, conventional surge protection devices might not be able to prevent or slow down the formation of arcing. When the arcing is severe enough, it may introduce perforations on the metallic conduit. These perforations may cause the leakage of substances that are carried by the metallic conduit. Such leakage can be hazardous when the metallic conduit is used for delivering toxic and/or flammable gas substances.

Thus, there is a need for a surge protection device with an improved response time and is designed for protecting metallic conduits.

SUMMARY

The present invention may provide a surge current sensor and a surge protection system that deploys one or more surge current sensors. When an electrical surge is introduced to a metallic conduit, the current component may generally lead the voltage component. Hence, being able to sense the surge current may help improve the response time for preventing or slow down the formation of arcing. The surge current sensor may be placed on or near to a metallic conduit, and it may be used for sensing the surge current conducted therein. Once the surge current sensor detects a substantial amount of surge current, the surge protection system may initiate a surge protection mechanism. Upon being executed, the surge protection mechanism may prevent or significantly slow down the damages that could be caused by the electrical surge.

In one embodiment, the present invention may provide a surge current sensor for placement in proximity of a conduit. The surge current sensor may include a current transformer having an arc surface configured to receive a magnetic flux generated by a surge current in the conduit, the current transformer transforming the received magnetic flux to a voltage, and a processor coupled with the current transformer, and configured to generate a digital signal based on the voltage, the digital signal representing a surge magnitude of the surge current.

In another embodiment, the present invention may provide a surge protection system, which may include a surge sensor for placement adjacent to a conduit, and having a current transformer for sensing a surge current of the conduit, the surge sensor configured to generate a digital signal representing the sensed surge current, and a controller in communication with the surge sensor, the controller configured to determine an occurrence of a surge event based on the digital signal and, upon determining the occurrence of the surge event, generate a notification signal for requesting a surge protection response.

In yet another embodiment, the present invention may provide a method for responding to a surge event. The method may include the steps of sensing a surge current conducted by a conduit, determining a surge energy carried by the surge current, and triggering a protection response when the surge energy exceeds a predetermined value.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Apparatus, systems and methods that implement the embodiment of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between reference elements. In addition, the first digit of each reference number indicates the figure in which the element first appears.

Figure 1:
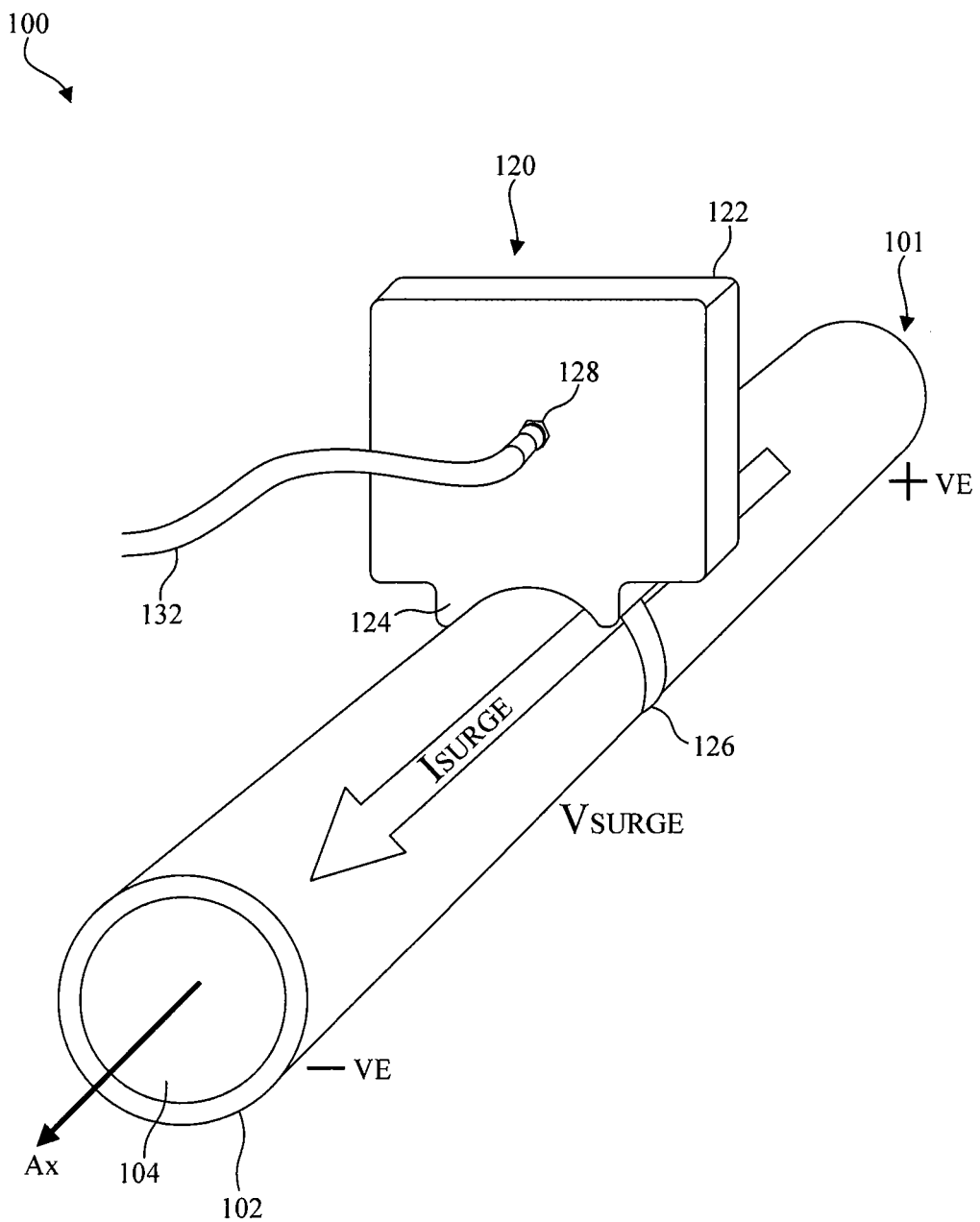
FIG. 1 shows a perspective view of a surge current sensor for use in a surge current sensing system according to an embodiment of the present invention.

FIG. 1 shows a perspective view of a surge current sensor 120 for use in a surge current sensing system 100 according to an embodiment of the present invention. The surge current sensing system 100 may be used for sensing a surge current $I_{SURGE}$ conducted by a conduit 101 during a surge event. The conduit 101 may include a conduit wall 102 and a conduit cavity (channel) 104 defined by the conduit wall 102. The conduit wall 102 may include various layers, such as a conductive layer and/or an insulation layer. One or more of the conduit wall 102 layers may demonstrate or possess an impedance characteristic, such as a resistance, a capacitance, and/or an inductance.

As a result, the surge current $I_{SURGE}$ may create a surge voltage $V_{SURGE}$ across the longitudinal axis $A_X$ of the conduit wall 102. The surge current $I_{SURGE}$ may combine with the surge voltage $V_{SURGE}$ to dissipate surge energy along the conduit wall 102. When the surge energy exceeds a threshold value, it may cause damages to the conduit wall 102. In order to prevent and/or mitigate damages caused by the surge energy, it may be desirable to monitor the surge event by sensing the surge current conducted along the conduit wall 102.

The conduit 101 may be used for various purposes. In one embodiment, the conduit 101 may be a utility conduit for providing utility service, which may include but not limited to gas, electricity, or water. The conduit 101 may service a utility consumer, such as a domestic building and/or a commercial building. The conduit cavity 104 may be used for delivering the utility service, while the conduit wall 102 may be used for preventing the utility service from contamination and/or leakage. When the conduit 101 is used for delivering electricity, the conduit cavity 104 may receive a power cable, while the conduit wall 102 may protect the power cable from physical damage and/or power leakage.

In another embodiment, the conduit 101 may be a communication conduit for conducting communication signals between two pieces of communication equipment. The conduit 101 may service a transmitting device and a receiving device. The conduit cavity 104 may be used for receiving a communication cable, such as a coaxial cable, while the conduit wall 102 may be used for protecting the communication cable from breakage and/or interference.

The surge current sensor 120 may include a housing 122 and a transformation arc surface 124. The transformation arc surface 124 may have a curvature for fitting an exterior cross-sectional surface of the conduit wall 102. The transformation arc surface 124 may be placed in contact with the conduit wall 102, adjacent to the conduit wall 102, or in proximity of the conduit wall 102. In order to stabilize and/or secure the surge current sensor 120 against the conduit 101, a fastener belt 126 may be used for fastening the surge current sensor 120 to the conduit wall 102. The transformation arc surface 124 may be used for receiving a magnetic flux generated by the surge current $I_{SURGE}$. The electronic components placed within the housing 122 may transform the received magnetic flux to a scaled voltage and further process the scaled voltage to generate one or more sensing signals.

The sensing signals may serve various purposes, which may include, but is not limited to, informing a user about the magnitude and duration of a sensed surge current $I_{SURGE}$, triggering a protection response mechanism for terminating the utility service, and/or triggering a protection response mechanism for disconnecting the conduit 101 from the device it services. In one embodiment, for example, the sensing signals may include an interrupt signal that triggers the protection response mechanism. In another embodiment, for example, the sensing signal may include a digital signal that carries digital values representing the magnitude and duration of the surge current $I_{SURGE}$. In yet another embodiment, for example, the sensing signal may include an analog signal that represents a transient waveform of the surge current $I_{SURGE}$.

The surge current sensor 120 may include an output port 128, which may be used for delivering the sensing signals. An output cable 132 may be connected to the output port 128 for receiving the sensing signals. In return, the output cable 132 may transmit the sensing signals to a master controller and/or a surge reactor, which will be shown and discussed in the following sections. As discussed herein but without imposing any limitation thereto, a master controller may be a device that can further process the sensing signals, determine the occurrence and/or magnitude of a surge event, inform a user about the occurrence and/or magnitude of the surge event, and/or trigger a protection response mechanism based on the occurrence and/or magnitude of a surge event.

Figure 2:
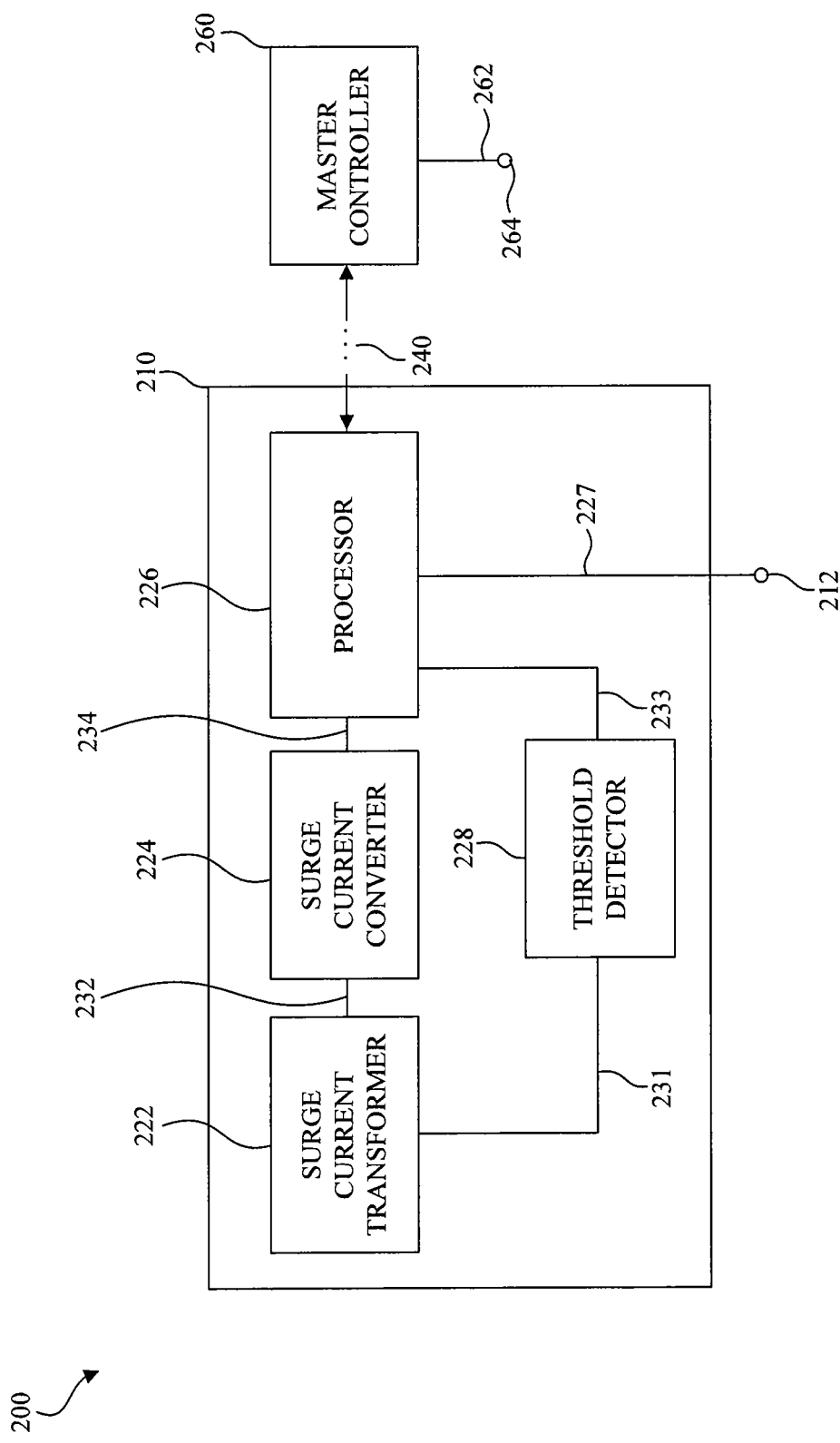
FIG. 2 shows a schematic block diagram of a surge detection system according to an embodiment of the present invention.

FIG. 2 shows a schematic block diagram of a surge detection system 200 according to an embodiment of the present invention. The surge detection system 200 may include a surge current sensor 210 and a master controller 260. Generally, the surge current sensor 210 may be used for sensing the surge current, and the master controller 260 may be used for determining the occurrence or magnitude of a surge event based on the sensed surge current 231. The master controller 260 may be directly connected to the surge current sensor 210. Alternatively, the master controller 260 may be indirectly connected to the surge current sensor 210 via a communications network.

Both the surge current sensor 210 and the master controller 260 may respond to the sensed surge current 231. In one embodiment, for example, the surge current sensor 210 may generate an emergency response. In another embodiment, for example, the master controller 260 may generate a user-authorized response. The emergency response may trigger a unilateral protection mechanism which may require very little or no human intervention, while the user-authorized response may request a user authorization before triggering a protection mechanism. Depending on the type of conduit to which the surge detection system 200 is applied, the protection mechanism may include, but is not limited to, the termination of utility service and/or the disconnection of the conduit from the device it services.

The surge current sensor 210 may be used for implementing the function features of the surge current sensor 120 as discussed in FIG. 1. The surge current sensor 210 may include a surge current transformer 222, a surge current converter 224, a processor 226, and optionally a threshold detector 228. The surge current transformer 222 may be used for generating a transformed surge current signal 232. The transformed surge current signal 232 may have a waveform profile that tracks the waveform profile of the surge current. As such, the transformed surge current signal 232 may represent the transient amplitude of the surge current.

The surge current converter 224 may be coupled to the surge current transformer 222, and it may generate a converted surge current signal 234 based on the transformed surge current signal 232. In one embodiment, for example, the surge current converter 224 may generate the converted surge current signal 234 by amplifying the transformed surge current signal 232. In another embodiment, for example, the surge current converter 224 may generate the converted surge current signal 234 by filtering the high frequency noise from the transformed surge current signal 232. In yet another embodiment, for example, the surge current converter 224 may generate the converted surge current signal 234 by digitizing the transformed surge current signal 232 at a high sampling rate.

When compared to the transformed surge current signal 232, the converted surge current signal 234 may have higher amplitude resolution, improved signal integrity, and high resistivity against corruption and noise. Accordingly, the converted surge current signal 234 may be ready for transmission and/or further processing.

The processor 226 may be coupled to the surge current converter 224, and it may be used for processing the converted surge current signal 234. The processor 226 may determine or approximate the transient amplitude of the surge current by using the converted surge current signal 234. In one embodiment, for example, the processor 226 may access a set of predefined parameters, such as the impedance characteristics of the measured conduit. The predefined parameters may be used for calculating the transient amplitude of the surge current. In another embodiment, for example, the processor 226 may access a lookup table, which may map or relate the converted surge current signal 234 to one or more predetermined transient amplitudes of the surge current.

Based on the determined or approximated transient amplitude of the surge current, the processor 226 may ascertain the surge magnitude of the surge current. The processor 226 may include an interrupt mode, which may be enabled by a user input or by a default configuration. During the interrupt mode, the processor 226 may generate a surge interrupt signal 227 when the surge magnitude of the surge current exceeds a predetermined surge value over a predetermined period of time. The surge interrupt signal 227 may be delivered to a surge reactor via an interrupt output port 212. The surge interrupt signal 227 may be part of an emergency response, which may trigger a unilateral protection mechanism for protecting the conduit and/or the surroundings of the conduit.

Additionally, the processor 226 may communicate with the master controller 260 via a communication link 240, which may be a wired connection or a wireless connection. In one embodiment, for example, the processor 226 may send the converted surge current signal 234 to the master controller 260. In another embodiment, for example, the processor 226 may send the transient amplitude of the surge current to the master controller 260.

The master controller 260 may determine the surge energy of the surge current based on the transmitted information received from the processor 226. When the determined surge energy exceeds a predefined threshold, the master controller 260 may generate a notification signal 262 for notifying a user about the surge event. In return, the master controller 260 may request a user authorization to initiate the protection mechanism. Upon receiving the user authorization, the master controller 260 may instruct the surge reactor to commence the protection mechanism. The master controller 260 may send the notification signal 262 and receive the user authorization via a master controller port 264.

The threshold detector 228 may be connected to the surge current transformer 222 and the processor 226. The threshold detector 228 may be used for distinguishing imminent surge current from the current introduced by background noise. The threshold detector 228 may adopt one or more predefined threshold values in distinguishing the imminent surge current from the current introduced by background noise.

In one embodiment, for example, the threshold detector 228 may generate an enable signal 233 when the surge magnitude of the surge current exceeds a predefined magnitude threshold. In another embodiment, for example, the threshold detector 228 may generate the enable signal 233 when the rise time of the surge current is within a predefined rise time threshold. In yet another embodiment, the threshold detector 228 may generate an enable signal 233 when the surge magnitude of the surge current exceeds the predefined magnitude threshold, and when the rise time of the surge current is within the predefined rise time threshold. Depending on the impedance characteristics of the conduit, the predefined rise time threshold may range, for example, from about 8 milliseconds to about 10 milliseconds.

The enable signal 233 may be used for enabling one or more functionalities of the processor 226. In one embodiment, for example, the enable signal 233 may enable the interrupt mode of the processor 226. In another embodiment, for example, the enable signal 233 may enable the communication between the processor 226 and the master controller 260. In yet another embodiment, for example, the enable signal 233 may enable the interrupt mode of the processor 226, as well as the communication between the processor 226 and the master controller 260.

Although FIG. 2 shows that the surge current converter 224, the processor 226, and the threshold detector 228 are three individual components, they may be integrated into a single component according to an embodiment of the present invention. Moreover, the surge current sensor 210 may be modulated, such that the surge current sensor 210 may pair with various surge current transformers 222.

Figure 3:
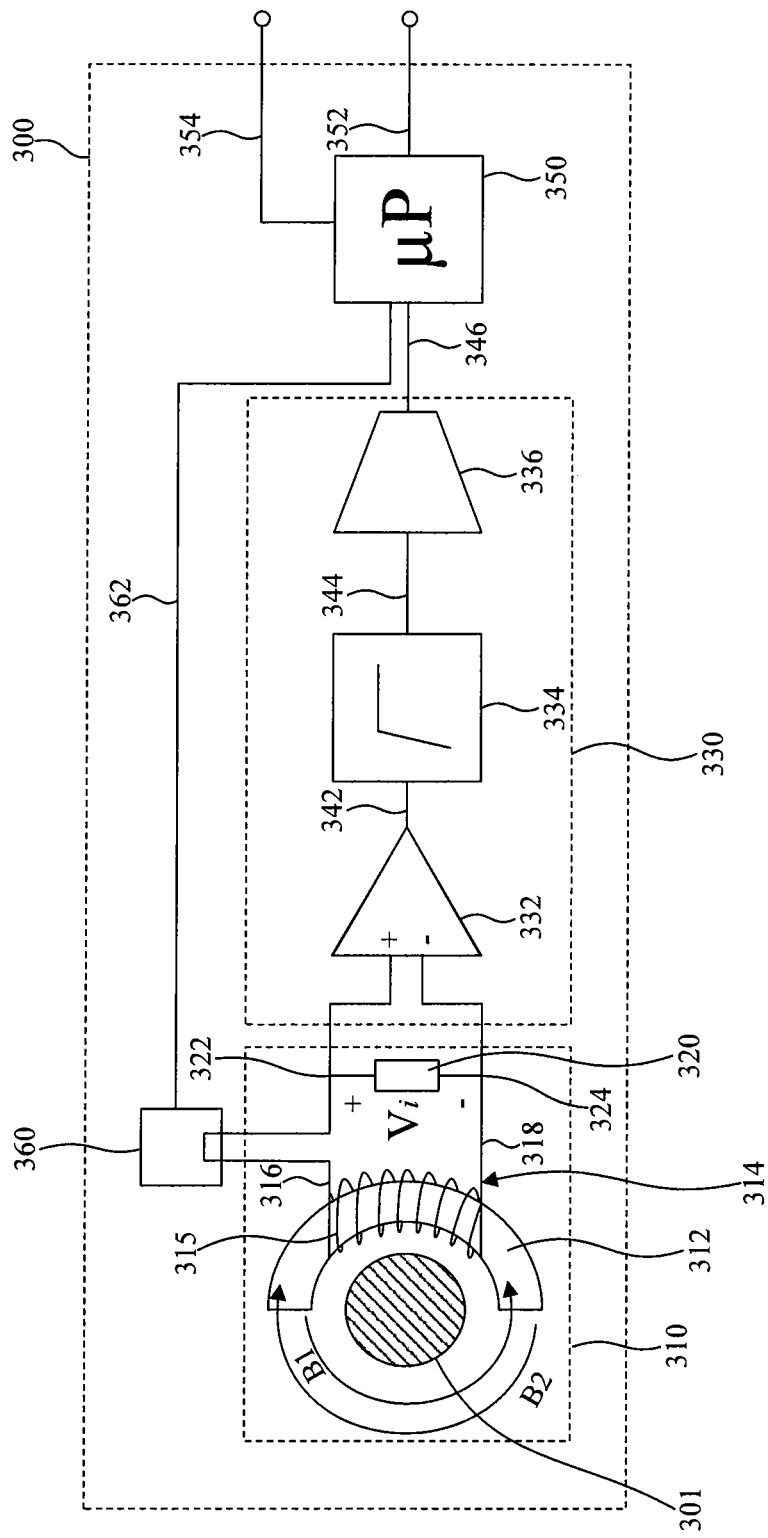
FIG. 3 shows a schematic diagram of a surge current sensor according to an embodiment of the present invention.

FIG. 3 shows a schematic diagram of a surge current sensor 300 according to an embodiment of the present invention. Generally, the surge current sensor 300 may be used for implementing, but without limiting, the functional features of the surge current sensor 120 and the surge current sensor 210. The surge current sensor 300 may include several modules, such as a surge current transforming module 310, a surge current conversion module 330, a microprocessor module 350, and a threshold detection module 360. In one embodiment, each of these modules may be formed on an individual printed circuit board. In another embodiment, two or more of these modules may share a single printed circuit board.

The surge current transforming module 310 may be used for implementing, but without limiting, the functional features of the surge current transformer 222 as discussed in FIG. 2. Particularly, the surge current transforming module 310 may include a magnetic core (a.k.a. core magnet) 312, a wire 314, and a shunt component 320. The magnetic core 312 may have a semi-circular shape for partially circumscribing the cross-sectional surface of a conduit 301. Although FIG. 3 shows that the magnetic core 312 has a semi-circular shape, the magnetic core 312 may have other shapes that are suitable for circumscribing the cross-sectional surface of the conduit 301.

When the conduit 301 conducts a surge current (primary current), the surge current may induce a magnetic flux around the conduit 301. Depending on the direction of the surge current, the magnetic flux may include a first (counter-clockwise) magnetic flux B1 and/or a second (clockwise) magnetic flux B2. By virtue of positioning around, adjacent to, or in contact with the conduit 301, the magnetic core 312 may have a receiving segment for receiving the magnetic flux.

The wire 314 may include a first end (leg) 316, a second end (leg) 318, and a coiled segment 315 that connects the first end 316 and the second end 318. The first end 316 may be coupled to a first node 322, and the second end 308 may be coupled to a second node 324. The coiled segment 315 may coil around the receiving segment of the magnetic core 312. As a result, a scaled current (secondary current) may be induced in the coiled segment 315 of the wire 314. The scaled current may track the surge current such that it may have a similar transient profile as the surge current. The scaling ratio between the scaled current and the surge current may depend on the number of turns of the coiled segment 315 and other factors. Generally, the higher number of turns, the bigger the scaling ratio. In one embodiment, for example, the coiled segment 315 may have about 90 turns. In another embodiment, for example, the coiled segment 315 may have between about 90 to about 110 turns.

When the surge current is expected to have a very high peak value, such as 5000 A, it may be desirable to have a relatively high scaling ratio, which may limit the range of scaled current for protecting other electronic modules within the surge current sensor 300. Moreover, the relationship between the surge current $I_{SURGE}$ and the scaled current $I_{SCALED}$ may be governed by one or more second order equations. In one embodiment, for example, the relationship between the surge current $I_{SURGE}$ and the scaled current $I_{SCALED}$ may be characterized by:

$$I_{SURGE}=0.103+(I_{SCALED}\times 139.9)+(I_{SCALED}^2\times 10)$$

The scaled current may flow through the first node 322, the shunt component 320, and the second node 324. The shunt component 320 may be coupled with the wire 314 to form a complete circuit, thereby allowing a scaled voltage $V_i$ to be established across the first node 322 and the second node 324. In one embodiment, the shunt component 320 can be a resistor such that the scaled voltage $V_i$ may have a linear relationship with the scaled current. The scaled voltage $V_i$ may serve as the transformed surge current signal 232 as discussed in FIG. 2. As a result, the scaled voltage $V_i$ may be received by the surge current conversion module 330.

The surge current conversion module 330 may be used for implementing, but without limiting, the functional features of the surge current converter 224 as discussed in FIG. 2. Particularly, the surge current conversion module 330 may include a differential amplifier 332, a low pass filter 334, and an analog-to-digital converter (ADC) 336.

The differential amplifier 332 may amplify the scaled voltage $V_i$ to generate a differential mode output signal 342. As a result of the amplification, a slight change of the surge current may be properly detected. To enhance the sensitivity of the detection process, the differential amplifier 332 may have a relatively high common-mode rejection ratio (CMRR). In one embodiment, for example, the differential amplifier 332 may have a CMRR ranges from about 70 dB to about 90 dB. In another embodiment, for example, the differential amplifier 332 may have a CMRR ranges from about 90 dB to about 120 dB. In yet another embodiment, for example, the differential amplifier 332 may have a CMRR ranges from about 70 dB to about 120 dB.

After the differential mode output signal 342 is generated, the low pass filter 334 may be used for eliminating or substantially reducing the influence of high frequency noise introduced in the conduit 301. In one embodiment, the low pass filter 334 may be coupled in series with the differential amplifier 332. As such, the low pass filter 334 may filter the high frequency noise at the output end of the differential amplifier 332. In another embodiment, the low pass filter 334 may be incorporated in a feedback path of the differential amplifier 332. As such, the low pass filter 334 may eliminate or minimize the influence of high frequency noise at the input end of the differential amplifier. In yet another embodiment, the low pass filter 334 may have a first component and a second component. The first component may be incorporated in the feedback path of the differential amplifier, while the second component may be coupled in series with the differential amplifier 332. As a result, the low pass filter 334 may eliminate the high frequency noise at both the input end and output end of the differential amplifier 332.

Generally, the low pass filter 334 may generate a filtered output signal 344 when a frequency falls within the range of a typical surge current frequency. In an embodiment, for example, the filtered output signal 344 may have a frequency that is below about 100 MHz. In another embodiment, the filtered output signal 344 may have a frequency ranges from about 100 MHz to about 1 MHz. In yet another embodiment, the filtered output signal 344 may have a frequency that is below about 1 MHz.

The filtered output signal 344 may be digitized by the analog-to-digital converter (ADC) 336. The ADC 336 may sample the filtered output signal 344 at a sampling rate that may provide high enough transient resolution for detecting a surge event or determining the surge energy released by the surge event. In one embodiment, for example, the ADC 336 may have a sampling rate that ranges from about 500 kilo-sample-per-second (ksps) to about 2000 ksps. In another embodiment, for example, the ADC 336 may have a sampling rate that ranges from about 1000 ksps to about 2000 ksps. In yet another embodiment, for example, the ADC 336 may have a sampling rate that ranges above 2000 ksps.

Moreover, the ADC may encode the filtered output signal 344 into a plurality of multi-bit digital values, which may be carried by a digital output signal 346. Each of the digital values may represent the transient amplitude of the filtered output signal 344 at or around a discrete time period. As such, several consecutive digital values may represent the transient amplitude of the filtered output signal 344 over a predetermined number of discrete time periods. Since the transient amplitude of the filtered output signal 344 may represent the transient amplitude of the surge current, several consecutive digital values of the transient amplitude may represent a transient segment of the surge current.

The surge current may have peak amplitude that ranges, for example, from about −5000 A to about 5000 A. Accordingly, each of the digital values may have a bit length that is long enough to represent the peak amplitude range of the surge current. In one embodiment, for example, the ADC 336 may have a register size that ranges from about 10 bits to about 20 bits. In another embodiment, the ADC 336 may have a register size that ranges from about 10 bits to about 15 bits. In yet another embodiment, for example, the ADC 336 may have a register size that ranges from about 16 bits to about 20 bits.

The digital output signal 346 may be a single serial output signal or a bus of parallel output signal. The ADC 336 may transmit the digital values by using various transmission modes. In one embodiment, for example, the ADC 336 may include an internal buffer for storing the digital values before transmitting them. In another embodiment, for example, the ADC 336 may transmit the digital values as are generated. In yet another embodiment, for example, the ADC 336 may transmit the real time digital values only upon request.

The microprocessor module 350 may be used for implementing, but without limiting, the functional features of the processor 226 as discussed in FIG. 2. The microprocessor module 350 includes any types of microprocessor, which may be coupled to a memory device. The microprocessor may be used for processing the digital output signal 346 received from the ADC 336. The memory device may be coupled to the microprocessor, and it may be use for storing various data, which may be accessed by the microprocessor for determining the nature of the surge current. In one embodiment, for example, the memory device may be used for storing parameters that are related to the impedance characteristics of the conduit 301. In another embodiment, for example, the memory device may be used for storing one or more transfer functions and/or gain information related to the differential amplifier 332, the low pass filter 334, and/or the ADC 336. In yet another embodiment, for example, the memory device may be used for storing one or more look-up tables for mapping the plurality of digital value to a plurality surge current values and/or a plurality of surge energies.

The microprocessor module 350 may receive the plurality of digital values by extracting them from the digital output signal 346. The microprocessor module 350 may generate a surge interrupt signal 354 for triggering a surge reactor (not shown) to generate a surge protection response. The surge interrupt signal 354 may be generated based on one or more digital values extracted from the digital output signal 346.

In one embodiment, for example, the microprocessor module 350 may generate the surge interrupt signal 354 when one of the digital values exceeds a first predetermined value. This event may signify that the surge current at a particular point of time may be significantly higher than a maximum level which the conduit 301 may tolerate. In another embodiment, for example, the microprocessor module 350 may generate the surge interrupt signal 354 when two or more consecutive digital values exceed a second predetermined value. This event may signify that the surge current over a particular period of time may be significantly higher than an average level which the conduit 301 may tolerate.

A sudden surge current spike may cause damage to the conduit 301 when the magnitude thereof is substantially high, whereas a longer surge current pulse may cause similar damage even when the average magnitude thereof is substantially low. As such, the first predetermined value may be much higher than the second predetermined value. The first and second predetermined values may be pre-calculated and stored in the memory device. Alternatively, the first and second predetermined values may be calculated real-time by using the parameters and/or transfer functions stored in the memory device.

Additionally, the microprocessor module 350 may transmit the plurality of digital values in the form of a serial output signal 352. In one embodiment, the microprocessor module 350 may begin the transmission upon receiving an enable signal 362 from the threshold detection module 360. In another embodiment, the microprocessor module 350 may begin the transmission upon generating the surge interrupt signal 354. In yet another embodiment, the microprocessor module 350 may begin the transmission upon a request signal received from a remote master controller, such as the master controller 260 as shown in FIG. 2. In transmitting the serial output signal 352, the microprocessor module 350 may utilize one or more wireless transceivers (not shown) to establish a wireless communication with the master controller 260. Alternatively, the microprocessor module 350 may transmit the serial output signal 352 via a wired connection with the master controller 260.

One or more of the functional blocks of the microprocessor module 350 may be enabled and/or disabled by an enable signal 362 generated by the threshold detection module 360. In one embodiment, for example, the enable signal 362 may enable and/or disable the generation of the surge interrupt signal 354. In another embodiment, for example, the enable signal 362 may enable and/or disable the transmission of the serial output signal 352. In yet another embodiment, for example, the enable signal 362 may enable and/or disable the digital value extraction function of the microprocessor module 350.

The enable signal 362 may be generated by the threshold detection module 360 based on one or more conditions of the scaled current conducted in the surge current transforming module 310. The threshold detection module 360 may be used for implementing, but without limiting, the functional features of the threshold detector 228 as discussed in FIG. 2. More specifically, the threshold detection module 360 may be used for distinguishing real surge current from current introduced by high frequency background noises. With the help of the threshold detection module 360, the surge current sensor 300 may reduce the number of incidents in which the surge interrupt signal 354 is prematurely generated or in which the microprocessor module 350 may overreact.

In one embodiment, for example, the threshold detection module 360 may generate the enable signal 362 when the transient magnitude of the scaled current exceeds a predetermined value. Because the transient magnitude of the scaled current may represent the transient magnitude of the surge current, the enable signal 362 may be generated when the transient magnitude of the surge current is beyond a regulation level. In another embodiment, for example, the threshold detection module 360 may generate the enable signal 362 when the rise time of the scaled current is within the range of a predetermined rise time. The rise time of the scaled current may indicate whether the surge current is induced by a surge event or by background noises. In one embodiment, the predetermined rise time may range, for example, from about 6 ms to about 10 ms. In another embodiment, the predetermined rise time may be about 8 ms.

Figure 4:
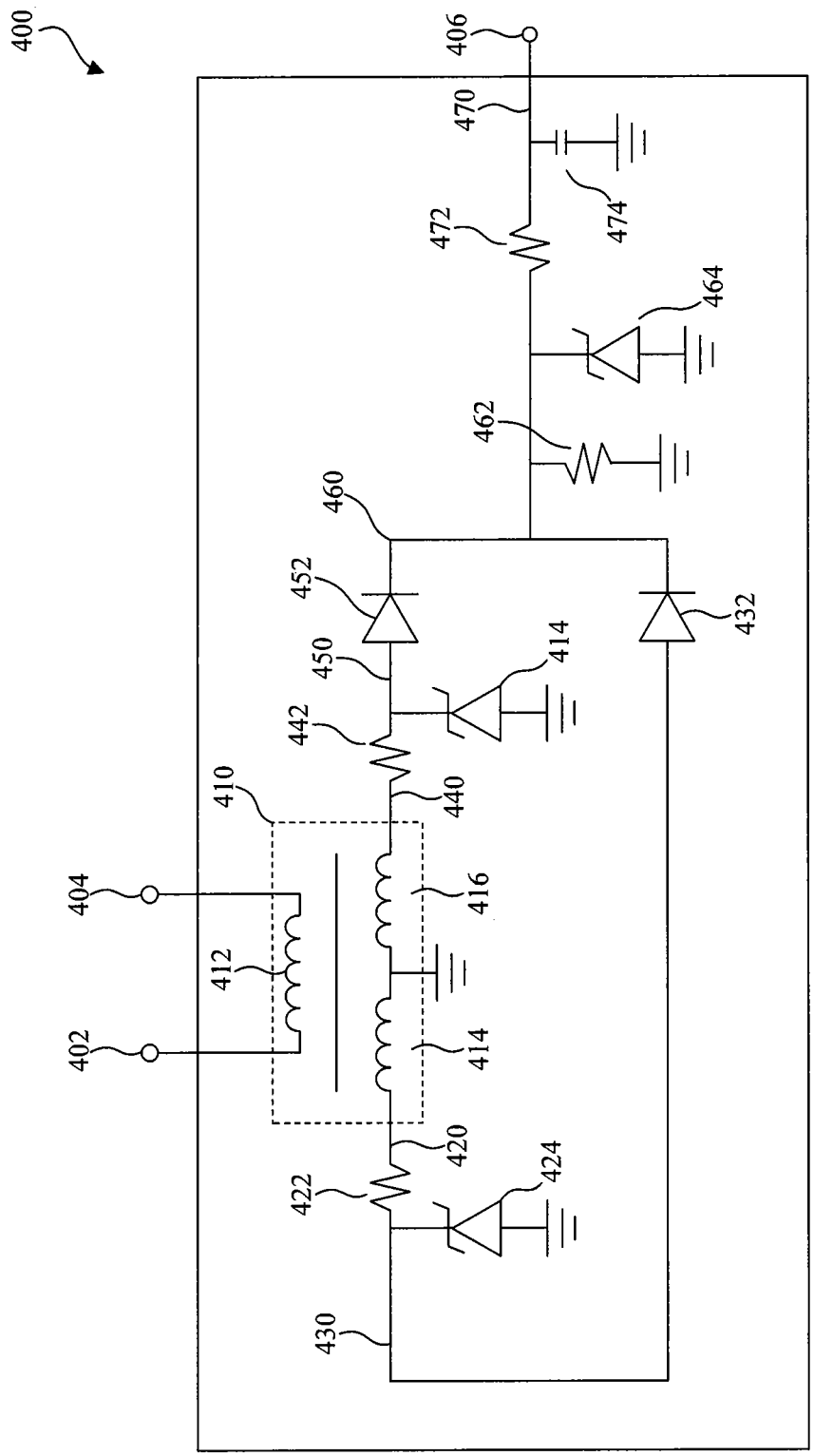
FIG. 4 shows a schematic diagram of a threshold detector according to an embodiment of the present invention.

FIG. 4 shows a schematic diagram of a threshold detector 400 according to an embodiment of the present invention. Generally, the threshold detector 400 may be used for implementing the functional features of the threshold detector 360 and/or the threshold detector 228.

The threshold detector 400 may include a current extraction component 410 for extracting a portion of the scaled current from the surge current transforming module 310 as shown in FIG. 3. The current extraction component 410 may include a primary inductor 412, a pair of secondary inductors, such as the first secondary inductor 414 and a second secondary inductor 416. The primary inductor 412 may be connected to a first input port 402 and a second input port 404. The first input port 402 may be coupled to the first end 316 of the wire 314 while the second input port 404 may be coupled to the first node 322. In such a manner, the scaled current may flow through the primary inductor 412 before returning to the current transforming module 310.

The scaled current flowing in the primary inductor 412 may induce a first sampled current in the first secondary inductor 414 and a second sampled current in the second secondary inductor 416. The first and second sampled currents may be a relatively fraction of the scaled current, such that they will not reduce the magnitude of the scaled current in any significant way. Moreover, the first and second sampled currents may be used for measuring the profile of the surge current. As such, the first and second sampled currents may each have a transient profile that matches the transient profile of the surge current.

The first sampled current may flow through a first transformed node 420, which may have a first transformed potential that is based on the inductance of the first secondary inductor 414. The first sampled current may flow across a first limiting resistor 422 for creating a potential drop between the first transformed node 420 and a first clamped node 430. The voltage of the first clamped node 430 may be clamped by a high breakdown device, such as a first clamping (Zener) diode 424. In order to protect the high breakdown device, the first limiting resistor 422 may have a resistance that can substantially limit the clamped voltage at the first clamped node 430. Moreover, because of the potential drop, the resistance of the first limiting resistor 422 may also help set the amplitude threshold of the surge current.

The first clamped node 430 may be coupled with a first rectifying diode 432. When the clamped voltage at the first clamped node 430 is higher than the threshold voltage of the first rectifying diode 432, the first rectifying diode 432 may be turned on for passing the first sampled current. However, when the sampled voltage at the first clamped node 430 is lower than the threshold voltage of the first rectifying diode 432, the first rectifying diode 432 may be turned off. As a result, the first sampled current may be blocked from passing the first rectifying diode 432. Therefore, the first rectifying diode 432 may allow a first polarity of the first sampled current to reach a rectified node 460.

The second sampled current may flow through a second transformed node 440, which may have a second transformed potential that is based on the inductance of the second secondary inductor 416. The second sampled current may flow across a second limiting resistor 442 for creating a potential drop between the second transformed node 440 and a second clamped node 450. The voltage of the second clamped node 450 may be clamped by a high breakdown device, such as a second clamping (Zener) diode 444. In order to protect the high breakdown device, the second limiting resistor 442 may have a resistance that can substantially limit the clamped voltage at the second clamped node 450. Moreover, because of the potential drop, the resistance of the second limiting resistor 442 may also help set the amplitude threshold of the surge current.

The second clamped node 450 may be coupled with a second rectifying diode 452. When the clamped voltage at the second clamped node 450 is higher than the threshold voltage of the second rectifying diode 452, the second rectifying diode 452 may be turned on for passing the second sampled current. However, when the sampled voltage at the second clamped node 450 is lower than the threshold voltage of the second rectifying diode 452, the second rectifying diode 452 may be turned off. As a result, the second sampled current may be blocked from passing the second rectifying diode 452. Therefore, the second rectifying diode 452 may allow a second polarity of the second sampled current to reach the rectified node 460.

The first polarity and the second polarity may be defined relatively, such that the first polarity is opposite of the second polarity. Generally, the passing first sampled current may represent a portion of the surge current that has amplitude with the first polarity, while the passing second sampled current may represent a portion of the surge current that has amplitude with the second polarity. When combined at the rectified node 460, the first and second passing sampled currents may establish a transient rectified voltage, which may represent the transient magnitude of the surge current.

In order to stabilize the transient rectified voltage, the rectified node 460 may be coupled to a leak path resistor 462 and a third clamping diode 464. The leak path resistor 462 may be used for draining the passing first and second sampled currents, so as to sustain the rectified voltage. The third clamping diode 464 may be used for suppressing sudden overshot voltage introduced to the rectified node 460.

Moreover, the rectified node 460 may be coupled to a low pass filter component for generating an enable signal with a low-frequency-response at an output node 470. The low pass filter component may include a low pass resistor 472 and a low pass capacitor 474. The low pass resistor 472 may be coupled between the rectified node 460 and the output node 470, while the low pass capacitor 474 may dielectrically couple the output node 470 with a ground source. As a result, the output node 470 may deliver the enable signal to the output port 406.

The discussion now turns to one or more surge detection systems that incorporate a plurality of surge current sensors. Generally, the surge detection system may be used for monitoring a plurality of conduits within the proximity of an infrastructure, which may be connected to and/or serviced by the conduits. The types of infrastructure may include, but is not limited to, domestic dwelling, commercial building, cell site tower, and/or other telecommunication equipment housing. The plurality of surge current sensors may have similar function features as, and be implemented by, the surge current sensor 120 as discussed in FIG. 1, the surge current sensor 210 as discussed in FIG. 2, and/or the surge current sensor 300 as discussed in FIG. 3.

Figure 5:
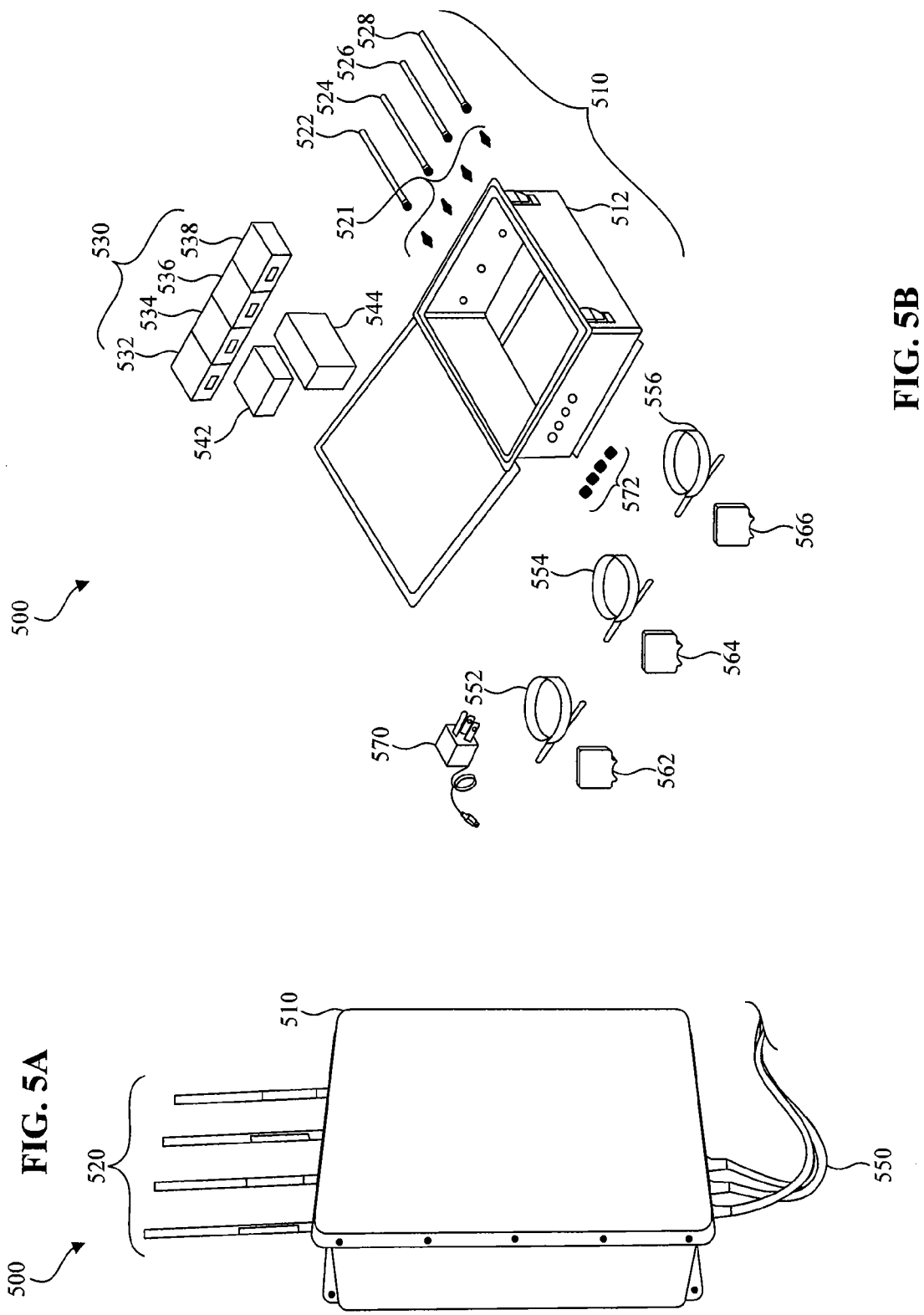
FIG. 5A shows a surge detection system according to an embodiment of the present invention.
FIG. 5B shows an exploded view of the surge detection system according to an embodiment of the present invention.

FIGS. 5A-5B show a perspective view and an exploded view of a surge detection system 500 according to an embodiment of the present invention. The surge detection system 500 may include a remote monitor unit 510. The remote monitor unit 510 may be equipped with a group of antennas (antenna group) 520 for communicating with a central system. Moreover, the remote monitor unit 510 may be coupled to a plurality of sensor cables 550 for receiving the sensing signals from a plurality of surge current sensors, such a first surge current sensor 562, a second surge current sensor 564, and a third surge current sensor 566.

Each of the sensing signals may be corresponding to a surge distress event occurring at a particular portion of a conduit. The first surge current sensor 562, the second surge current sensor 564, and the third surge current sensor 566 may be used for sensing the surge current of a conduit at various positions. In one embodiment, for example, the first surge current sensor 562 may be used for sensing the surge current of a conduit at a distal location. In another embodiment, the second surge current sensor 564 may be used for sensing the surge current of the conduit at an intermediate location. In yet another embodiment, the third surge current sensor 566 may be used for sensing the surge current of the conduit at a proximal location.

As discussed herein, the terms "distal location," "intermediate location," and "proximal location" are relatively terms used for describing various segments of a conduit. For example, the proximal location may be closer to the remote monitor unit 510 than the intermediate location. For another example, the intermediate location may be closer to the remote monitor unit 510 than the distal location.

The first surge current sensor 562, the second surge current sensor 564, and the third surge current sensor 566 may be used for sensing the surge currents of various conduits. In an embodiment, for example, the first surge current sensor 562 may be used for sensing the surge current of a first conduit, which can be a utility conduit or a communication conduit. In another embodiment, for example, the second surge current sensor 564 may be used for sensing the surge current of a second conduit, which can be a utility conduit or a communication conduit. In yet another embodiment, for example, the third surge current sensor 566 may be used for sensing the surge current of a third conduit, which can be a utility conduit or a communication conduit.

The remote monitor unit 510 may include an enclosure 512 for holding various electronic components. In one embodiment, for example, the enclosure 512 may be used for holding a transceiver group 530, which may include a first transceiver 532, a second transceiver 534, a third transceiver 536, and/or a fourth transceiver 538. In another embodiment, for example, the enclosure 512 may be used for holding a power regulator 542. In yet another embodiment, for example, the enclosure 512 may be used for holding a rechargeable battery 544.

The first transceiver 532 may be connected to the first surge current sensor 562 via the first sensor cable 552. The first transceiver 532 may be used for transmitting the digital output signal of the first surge current sensor 562 by driving a first antenna 522. The second transceiver 534 may be connected to the second surge current sensor 564 via the second sensor cable 554. The second transceiver 534 may be used for transmitting the digital output signal of the second surge current sensor 564 by driving a second antenna 524. The third transceiver 536 may be connected to the third surge current sensor 566 via the third sensor cable 556. The third transceiver 536 may be used for transmitting the digital output signal of the third surge current sensor 566 by driving a third antenna 526.

The fourth transceiver 538 may be used for transmitting handshake signals to the central system by driving a fourth antenna 528. The fourth transceiver 538 may also be used for receiving handshake signals from the central system. Depending on the communication protocol, a communication link between the remote monitor unit 510 and the central system can be established after they exchange several handshake signals. When the communication link is established, one or more of the first transceiver 532, the second transceiver 534, and the third transceiver 536 may begin sending the sensing signals to the central system. The fourth transceiver 538 may incorporate a microprocessor (not shown) to coordinate and/or monitor the transmission of the sensing signals among the first, second, and third transceivers 532, 534, and 536. The microprocessor may be independent of the microprocessor module 350 of each of the first surge current sensor 562, the second surge current sensor 564, and the third surge current sensor 566. As such, the microprocessor of the fourth transceiver 538 may be used for further processing the digital values of the surge current detected by each of the surge current sensors (e.g., the first surge current sensor 562, the second surge current sensor 564, and the third surge current sensor 566).

A group of cable guides 572 may be used for guiding the first sensor cable 552, the second sensor cable 554, and the third sensor cable 556 into the enclosure 512. Additionally, the group of cable guides 572 may help stabilize the connections between the sensor cables (e.g., the first sensor cable 552, the second sensor cable 554, and the third sensor cable 556) and the respective transceivers (e.g., the first transceiver 532, the second transceiver 534, and the third transceiver 536). Furthermore, the remote monitor unit 510 may include a group of bulkhead crimp jacks 521, which may be used for erecting and holding the first antenna 522, the second antenna 524, the third antenna 526, and the fourth antenna 528.

The power regulator 542 may be coupled to a power source via an external power plug 570. The power regulator 542 may be used for regulating the power received from the power source to one or more regulation levels. For example, the power regulator 542 may regulate the received power to a first regulation level, which may be within an operation range of the transceivers (e.g., the first transceiver 532, the second transceiver 534, and the third transceiver 536). For another example, the power regulator 542 may regulate the received power to a second regulation level, which may be within the operation range of the surge current sensors (e.g., the first surge current sensor 562, the second surge current sensor 564, and the third surge current sensor 566). After the regulation process, the power regulator 542 may distribute the regulated power to the transceivers (e.g., the first transceiver 532, the second transceiver 534, and the third transceiver 536) and/or the surge current sensors (e.g., the first surge current sensor 562, the second surge current sensor 564, and the third surge current sensor 566).

In one embodiment, the power source can be a typical AC outlet, such that the remote monitor unit 510 might not require any local power storage device. In another embodiment, the power source can be a solar panel, such that the remote monitor unit 510 may include a power storage device, such as a rechargeable battery 544, for storing energy for later consumption.

Figure 6:
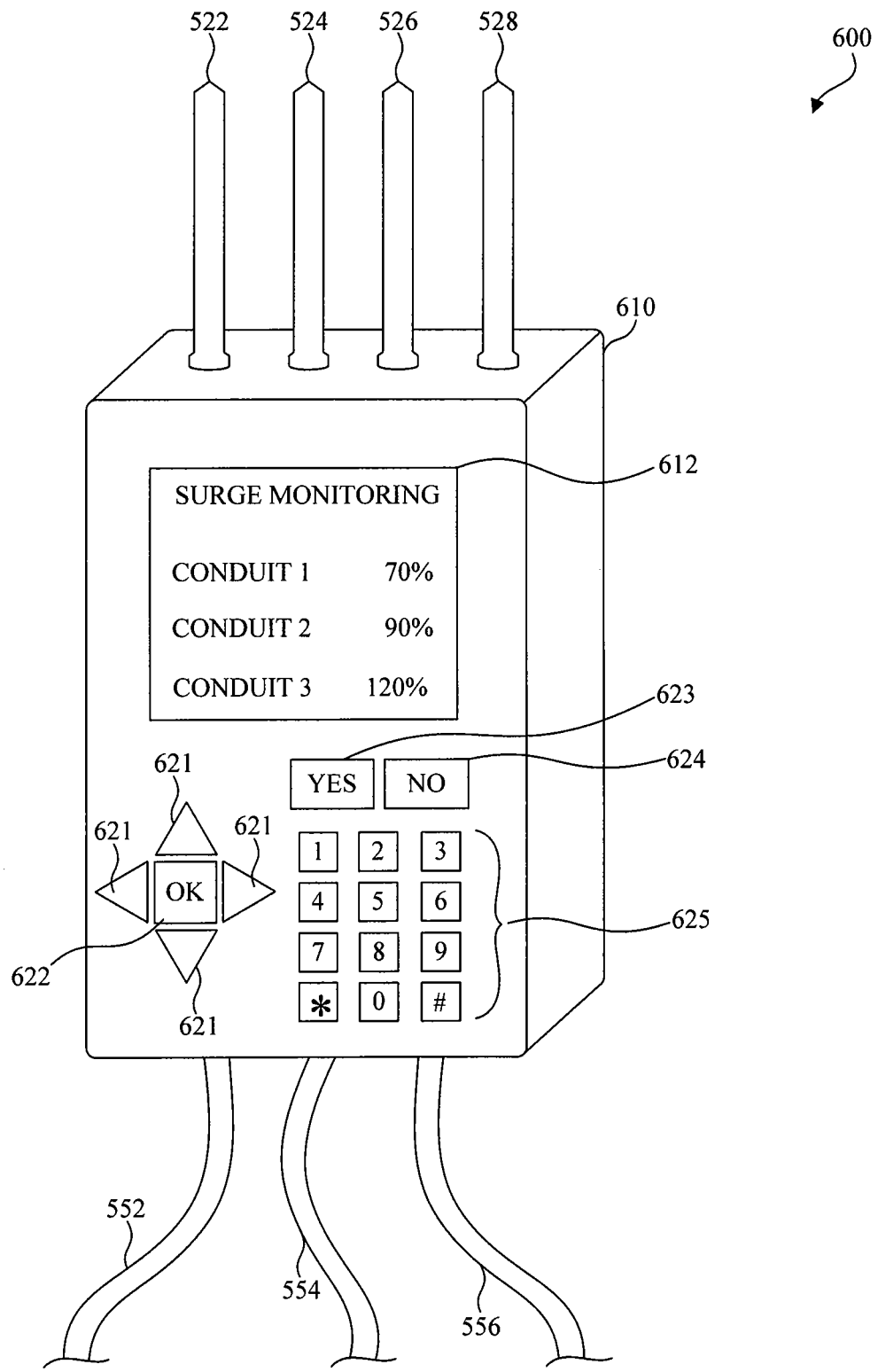
FIG. 6 shows a perspective view of a surge monitor unit according to an embodiment of the present invention.

FIG. 6 shows a perspective view of a surge monitor unit 600 according to an embodiment of the present invention. The surge monitor unit 600 may share many structural and functional features as the remote monitor unit 510. Additionally, the surge monitor unit 600 may include a human user interface (HUI) such that a user may monitor and respond to a surge event at a location at which the surge monitor unit 600. That is, a user may directly access and control the surge monitor unit 600 without using the central system. While the remote monitor unit 510 may be used in a centralized surge protection system, the surge monitor unit 600 may be beneficial in a decentralized surge protection system. Moreover, the surge monitor unit 600 may be used in a surge protection system which is operated and/or maintained by one or more on-site technicians.

The HUI of the surge monitor unit 600 may include a display screen 612, a set of direction buttons 621, an "OK" button 622, a "YES" button 623, a "NO" button 624, and a set of numeric buttons 625. The display screen 612 may be used for displaying output messages and/or images to a human user. In one embodiment, for example, the output messages may include the real-time surge current measurement of each conduit. In another embodiment, for example, the output messages may include a warning message for notifying the user about an impending surge event. In yet another embodiment, for example, the output message may include a request message for requesting the user to authorize a surge protection response. The surge protection response may include, but is not limited to, terminating the utility service provided by the conduit and/or disconnecting the conduit from a device which it services.

The set of direction buttons 621 and the "OK" button 622 may be used for browsing among and selecting one or more options. For example, the user may use the set of direction buttons 621 and the "OK" button 622 to select which conduit to be displayed or which surge protection response to be taken. The "YES" button 623 and the "NO" button 624 may be used for affirming or denying a request generated by the surge monitor unit 600. The set of numeric buttons 625 may be used for inputting numeric information to the surge monitor unit 600. The numeric information may include but not limited to administrator passwords, access passwords, telephone numbers, conduit parameter values, and/or predetermined surge threshold values.

Figure 7:
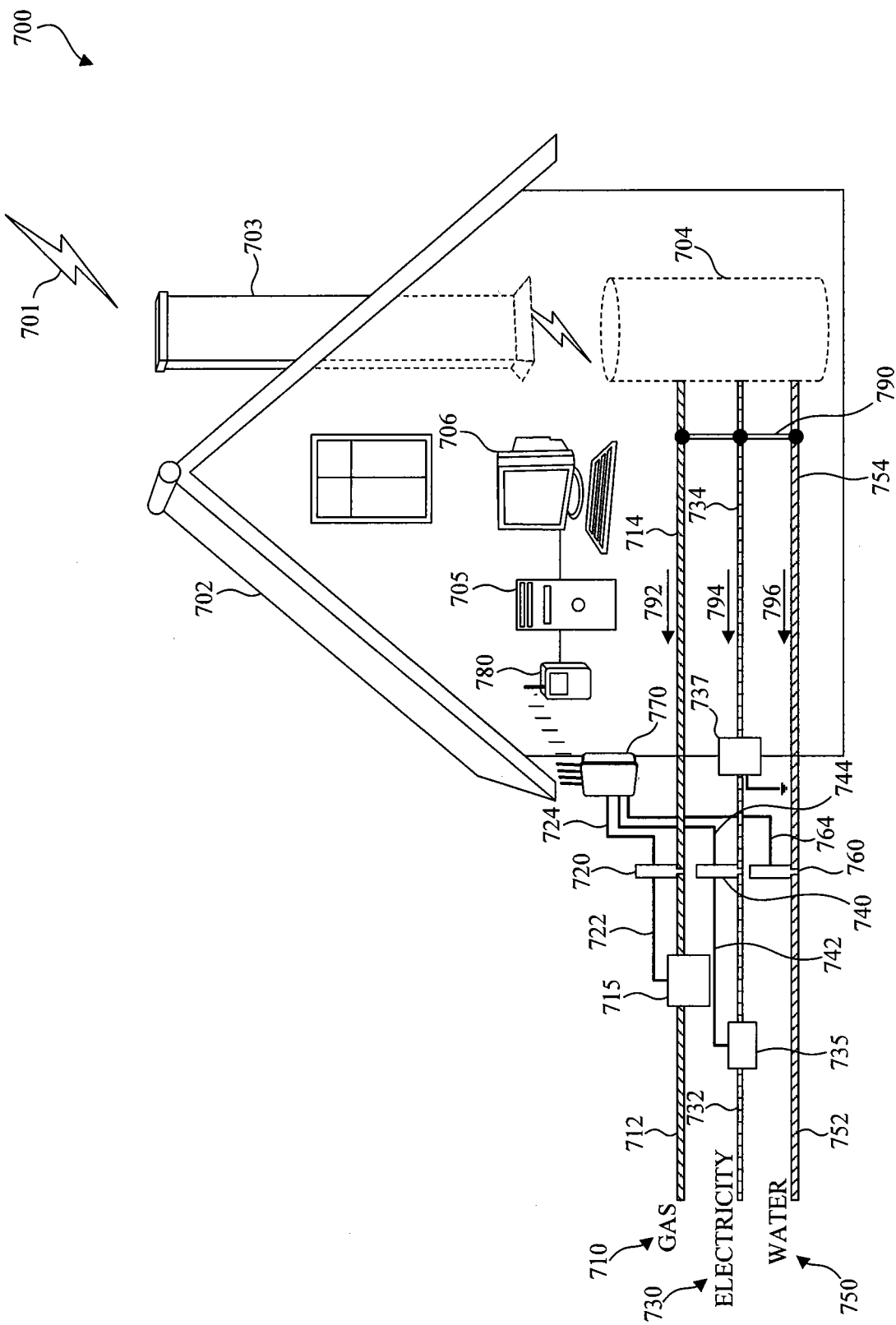
FIG. 7 shows a front view of a surge protection system for use in a dwelling according to an embodiment of the present invention.

The discussion now turns to various surge protection systems that include the surge detection system 500 as disclosed in FIGS. 5A and 5B. FIG. 7 shows a front view of a surge protection system 700 for use in a dwelling 702 according to an embodiment of the present invention. The surge protection system 700 may be used for protecting the dwelling 702 during a surge event, which may be caused by lightning 701. The charges of the lightning 701 may pass through a chimney 703 of the dwelling and eventually reach a household appliance, such as a water heater 704.

The water heater 704 may receive utility services from a gas supply system 710, an electricity supply system 730, and a water supply system 750. The gas supply system 710 may include an exterior gas pipe 712, an interior gas pipe 714, and a gas supply valve 715. The exterior gas pipe 712 may be used for transporting gas outside of the dwelling 702. The interior gas pipe 714 may be used for delivering gas to the interior of the dwelling 702. The gas supply valve 715 may pass the gas from the exterior gas pipe 712 to the interior gas pipe 714, or it may block the flow of gas between the exterior gas pipe 712 and the interior gas pipe 714.

The electricity supply system 730 may include an exterior electrical cable 732, an interior electrical cable 734, an electricity supply switch 735, and a ground fault protection device 737. The exterior electrical cable 732 and the interior electrical cable 734 may be protected by a cable sheath. The exterior electrical cable 732 may be used for conducting electricity outside of the dwelling 702. The interior electrical cable 734 may be used for delivering electricity to the interior of the dwelling 702. The electricity supply switch 735 may be used for turn on or turn off the electricity supply from the exterior electrical cable 732 to the interior electrical cable 734. The ground fault protection device 737 may provide a ground path for the cable sheath for discharging the surge energy during a surge event.

The water supply system 750 may include an exterior water pipe 752 and an interior water pipe 754. The exterior water pipe 752 may be used for transporting water outside of the dwelling 702. The interior water pipe 754 may be used for delivering water to the interior of the dwelling 702. As discussed herein, each of the gas pipes (e.g., the exterior and interior gas pipes 712 and 714), the electrical cable sheath, and the water pipes (e.g., the exterior and interior water pipes 752 and 754) can be classified as a utility conduit. Inside the dwelling 702, these utility conduits may optionally be coupled with one another by a potential equator 790 for sharing the surge energy. These utility conduits may conduct one or more surge currents during a surge event. For example, the interior gas pipe 714 may conduct a first surge current 792, the electrical cable sheath may conduct a second surge current 794, and the interior water pipe 754 may conduct a third surge current 796.

A surge detection system may be used for monitoring the surge currents in the utility conduit of each of the utility supply systems (e.g. the gas supply system 710, the electricity supply system 730, and the water supply system 750). The surge detection system may have similar structural and functional features as the surge detection system 500. Accordingly, the surge detection system may include a first surge current sensor 720, a second surge current sensor 740, a third surge current sensor 760, and a monitor unit 770.

The first surge current sensor 720 may be placed on the interior gas pipe 714, and it may be used for sensing the first surge current 792. The first surge current sensor 720 may generate a gas supply interrupt signal 722 based on the transient characteristics of the sensed first surge current 792 and according to the various embodiments as discussed in FIGS. 1-4. The gas supply interrupt signal 722 may be used for triggering a surge protection response generated by a surge reactor. In the case of the gas supply system 710, the surge reactor can be the gas supply valve 715 and the surge protection response may be terminating or shutting off the gas supply (i.e. utility service) flowing from the exterior gas pipe 712 to the interior gas pipe 714.

The second surge current sensor 740 may be placed on the electrical cable sheath, and it may be used for sensing the second surge current 794. The second surge current sensor 740 may generate an electricity supply interrupt signal 742 based on the transient characteristics of the sensed second surge current 794 and according to the various embodiments as discussed in FIGS. 1-4. The electricity supply interrupt signal 742 may be used for triggering a surge protection response generated by a surge reactor. In the case of the electricity supply system 730, the surge reactor can be the electricity supply switch 735 and the surge protection response may be terminating or switching off the electricity supply (i.e. utility service) conducting from the exterior electrical cable 732 to the interior electrical cable 734.

Additionally, each of the surge current sensors (e.g., the first, second, and third surge current sensors 720, 740, and 760) may generate a surge current data signal. In one embodiment, the first surge current sensor 720 may generate a first surge current data signal 724, which may carry a plurality of first digital values. Each of the first digital values may represent the transient magnitude of the first surge current 792 at or around a predetermined time period. As such, the surge energy imparted to the interior gas pipe 714 may be derived by using the first surge current data signal 724. For example, assuming the interior gas pipe 714 has an impedance of $Z_G$, the surge energy $E_{GAS}$ from time period T1 to time period T2 may be characterized by:

$$E_{GAS} = \int_{T1}^{T2} I_{surge}(t)^2 Z_G \, (dt)$$

In another embodiment, the second surge current sensor 740 may generate a second surge current data signal 744, which may carry a plurality of second digital values. Each of the second digital values may represent the transient magnitude of the second surge current 794 at or around a predetermined time period. As such, the surge energy imparted to the electrical cable sheath may be derived by using the second surge current data signal 744. For example, assuming the electrical cable sheath has an impedance of $Z_E$, the surge energy $E_{ELECTRICITY}$ from time period T1 to time period T2 may be characterized by:

$$E_{ELECTRICITY} = \int_{T1}^{T2} I_{surge}(t)^2 Z_E \, (dt)$$

In yet another embodiment, the third surge current sensor 760 may generate a third surge current data signal 764, which may carry a plurality of third digital values. Each of the third digital values may represent the transient magnitude of the third surge current 796 at or around a predetermined time period. As such, the surge energy imparted to the interior water pipe 754 may be derived by using the third surge current data signal 764. For example, assuming the interior water pipe 754 has an impedance of $Z_W$, the surge energy $E_{WATER}$ from time period T1 to time period T2 may be characterized by:

$$E_{WATER} = \int_{T1}^{T2} I_{surge}(t)^2 Z_W \, (dt)$$

When the monitor unit 770 is implemented by the remote monitor unit 510 as shown in FIG. 5B, the monitor unit 770 may wirelessly transmit the surge current data signal (e.g., the first, second, and third surge current data signals 724, 744, and 764) to the master controller 780. In return, the master controller 780 may calculate the surge energy and compare the calculated surge energy with a predetermined surge energy value. In calculating the surge energy, the master controller 780 may use the surge current data signal(s) of a particular conduit or a combination of conduits. If the calculated surge energy exceeds the predetermined surge energy value, the master controller 780 may initiate a request for a surge protection response. In one embodiment, the request may be displayed by the master controller 780. In another embodiment, the request may be sent to a computer 705, which may cause the request to be displayed by a monitor 706. A user may elect to authorize the request or decline the request. If a user authorizes the request, the master controller 780 may trigger one or more surge reactors (e.g., the gas supply valve 715 and/or the electricity supply switch 735) for generating the authorized surge protection response. On the other hand, if a user declines the request, the master controller 780 may refrain from triggering any surge reactor, and it may continue the calculation of surge energy for another time period.

When the monitor unit 770 is implemented by the surge monitor unit 600 as shown in FIG. 6, the surge energy calculation may be performed directly by the surge monitor unit 600. In calculating the surge energy, the monitor unit 770 may use the surge current data signal(s) of a particular conduit or a combination of conduits. Moreover, the monitor unit 770 may compare the calculated surge energy with a predetermined surge energy value. If the calculated surge energy exceeds the predetermined surge energy value, the monitor unit 770 may initiate a request for a surge protection response. The monitor unit 770 may display the request in the display screen 612 (See FIG. 6). In return, a user may elect to authorize the request or decline the request by using one of the interface buttons as shown in FIG. 6. If a user authorizes the request, the monitor unit 770 may trigger one or more surge reactors (e.g., the gas supply valve 715 and/or the electricity supply switch 735) for generating the authorized surge protection response. On the other hand, if a user declines the request, the monitor unit 770 may refrain from triggering any surge reactor, and it may continue the calculation of surge energy for another time period.

Depending on whether the master controller 780 is involved in generating the surge protection response, the surge protection system 700 may or might not include the master controller 780. In addition to the surge current sensors, the monitor unit 770, and the master controller 780, the surge protection system 700 may include one or more surge reactors (e.g., the gas supply valve 715 and/or the electricity supply switch 735) for generating one or more surge protection responses.

Figure 8:
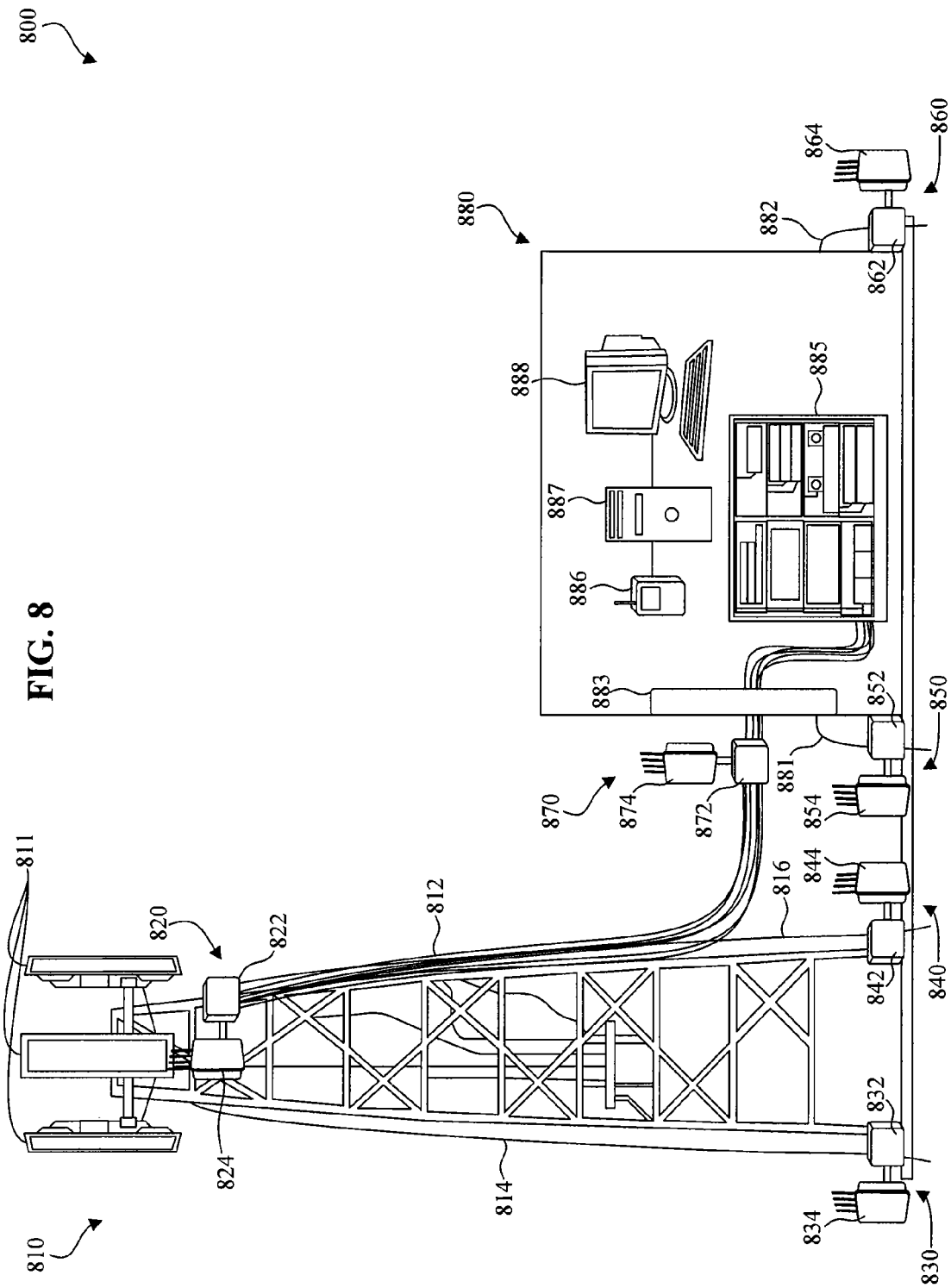
FIG. 8 shows a front view of a surge protection system for use in a telecommunication system according to an embodiment of the present invention.

FIG. 8 shows a front view of a surge protection system 800 for use in a telecommunication system according to an embodiment of the present invention. The telecommunication system may include a cell site tower 810 and an equipment but 880. The cell site tower 810 may include one or more antennas 811 for transmitting and receiving microwave signals. The equipment but 880 may include telecommunication equipment 885, which may be used for generating the signals to be transmitted by the antennas 811 and/or processing the signals received by the antennas 811. A group of communications cables 812 may be coupled with the antennas 811 and the telecommunication equipment 885 in order to deliver the transmitting signals and/or the received signals therebetween. Moreover, a bulkhead panel 883 may be installed at a wall of the equipment but 880. The bulkhead panel 883 may be used for receiving the communications cables 812.

The telecommunication system may include various ground wires, which may be used for conducting excessive surge currents to ground. The cell site tower 810, for example, may include a first cell site ground wire 814 and a second cell site ground wire 816, each of which may conduct surge currents from the top part of the cell site tower 810 to the ground. The equipment but 880, for another example, may include a first equipment but ground wire 881 for conducting surge currents from the bulkhead panel 883 to the ground. Moreover, the equipment but 880 may include a second equipment but ground wire 882 for conducting surge currents from the equipment but 880 to the ground. As discussed herein, these ground wires may be considered as surge protection conduits, while the communications cables 812 may be considered as communication conduits.

Ideally, each of the ground wires can substantially dissipate the surge currents such that minimum potential may be built up at the cell site tower 810, the equipment but 880, and/or the bulkhead panel 883. However, in reality, these ground wires may not be unable to dissipate the surge currents fast enough. As a result, a substantial amount of potential may be built up along the cell site tower 810, the equipment but 880, and/or the bulkhead panel 883.

In order to monitor the real-time dissipation of the surge currents, the surge protection system 800 may deploy a plurality of surge detection systems at various locations of the telecommunication system. The plurality of surge detection systems may help provide detailed information regarding the discharge paths of surge currents and data for reconstructing and analyzing the surge event. Generally, the surge detection systems may include similar functional and structural features as the surge detection system 500 as discussed in FIGS. 5A and 5B. Each of the surge detection systems may include a surge current sensor group and a remote monitor unit. The surge current sensor group may include one or more surge current sensors in a manner consistent with the disclosure of FIGS. 5A and 5B. The remote monitor unit may include similar components as the remote monitor unit 510, such that it may perform similar functions as the remote monitor unit 510.

Three surge detection systems may be deployed to the cell site tower 810. In one embodiment, for example, a tower top surge detection system 820 may be installed near or around the top of the cell site tower 810. The tower top surge detection system 820 may include a first surge current sensor group 822 and a first remote monitor unit 824. The first surge current sensor group 822 may be used for sensing the surge currents of the communications cables 812, the first cell site ground wire 814, and the second cell site ground wire 816 near or around the top of the cell site tower 810. The first surge current sensor group 822 may generate a plurality of surge current data signals for the respective conduits. The first remote monitor unit 824 may receive the plurality of surge current data signals and transmit them to a master controller 886.

In another embodiment, for example, a first tower base surge detection system 830 and a second tower base surge detection system 840 may be installed near or around the bottom of the cell site tower 810. The first tower base surge detection system 830 may include a second surge current sensor group 832 and a second remote monitor unit 834. Similarly, the second tower base surge detection system 840 may include a third surge current sensor group 842 and a third remote monitor unit 844. The second and third surge current sensor group 832 and 842 may be used for sensing the surge currents of the respective the first cell site ground wire 814 and the second cell site ground wire 816, which may be disposed near or around the bottom ground path junctions of the cell site tower 810. The second and third surge current sensor groups 832 and 842 may each generate a plurality of surge current data signals for the respective cell site ground wires 814 and 816. The second and third remote monitor units 834 and 844 may receive the plurality of surge current data signals and transmit them to the master controller 886.

Another three surge detection systems may be deployed around and/or near the equipment but 880. In one embodiment, for example, a first but base surge detection system 850 and a second but base surge detection system 860 may be installed near or around the bottom of the equipment but 880. The first but base surge detection system 850 may include a fourth surge current sensor group 852 and a fourth remote monitor unit 854. Similarly, the second but base surge detection system 860 may include a fifth surge current sensor group 862 and a fifth remote monitor unit 864. The fourth and fifth surge current sensor group 852 and 862 may be used for sensing the surge currents of the respective the first equipment but ground wire 881 and the second equipment but ground wire 882, which may be disposed near or around the bottom ground path junctions of the equipment but 880. The fourth and fifth surge current sensor groups 852 and 862 may each generate a plurality of surge current data signals for the respective equipment but ground wires 881 and 882. The fourth and fifth remote monitor units 854 and 864 may receive the plurality of surge current data signals and transmit them to the master controller 886.

In another embodiment, for example, a communications cable surge detection system 870 may be installed adjacent to the bulkhead panel 883. The communications cable surge detection 870 may include a sixth surge current sensor group 872 and a sixth remote monitor unit 874. The sixth surge current sensor group 872 may be used for sensing the surge currents of the communications cables 812 at or around the bulkhead panel 883. The sixth surge current sensor group 872 may generate a plurality of surge current data signals for the respective conduits. The sixth remote monitor unit 874 may receive the plurality of surge current data signals and transmit them to the master controller 886.

After receiving the surge current data signals from various remote monitor units (e.g., the first remote monitor unit 824, the second remote monitor unit 834, the third remote monitor unit 844, the fourth remote monitor unit 854, the fifth remote monitor unit 864, and/or the sixth remote monitor unit 874), the master controller 886 may process these surge current data signals and perform one or more functions according to the processing results.

The master controller 886 may determine, derive, and/or calculate one or more localized surge energies based on the surge current data extracted from the surge current data signals. Each of the localized surge energies may be imparted on various locations of the respective conduits. The master controller 886 may generate a surge energy map for tracing various surge current paths within the telecommunication system. Based on the surge energy map, the master controller 886 may determine one or more surge conditions.

In one embodiment, for example, the master controller 886 may determine whether the overall surge energy exceeds a predefined total surge energy level. In another embodiment, for example, the master controller 886 may determine whether the surge energy of a particular ground wire or a particular communications cable exceeds a respective localized energy level.

If the master controller 886 determines one or more surge conditions exist, the master controller 886 may generate a notification message for notifying a user of such conditions. Additionally, the master controller 886 may generate a request message for requesting authorization from a user to initiate a surge protection response. The notification message and/or the request message may be displayed directly by the master controller 886. Alternatively, the master controller 886 may send the notification message and/or request message to a computer 887, which may cause these messages to be displayed on a monitor 888. In the surge protection system 800, the surge protection response may include disconnecting the communications cables 812 from the telecommunication equipment 885.

Figure 9:
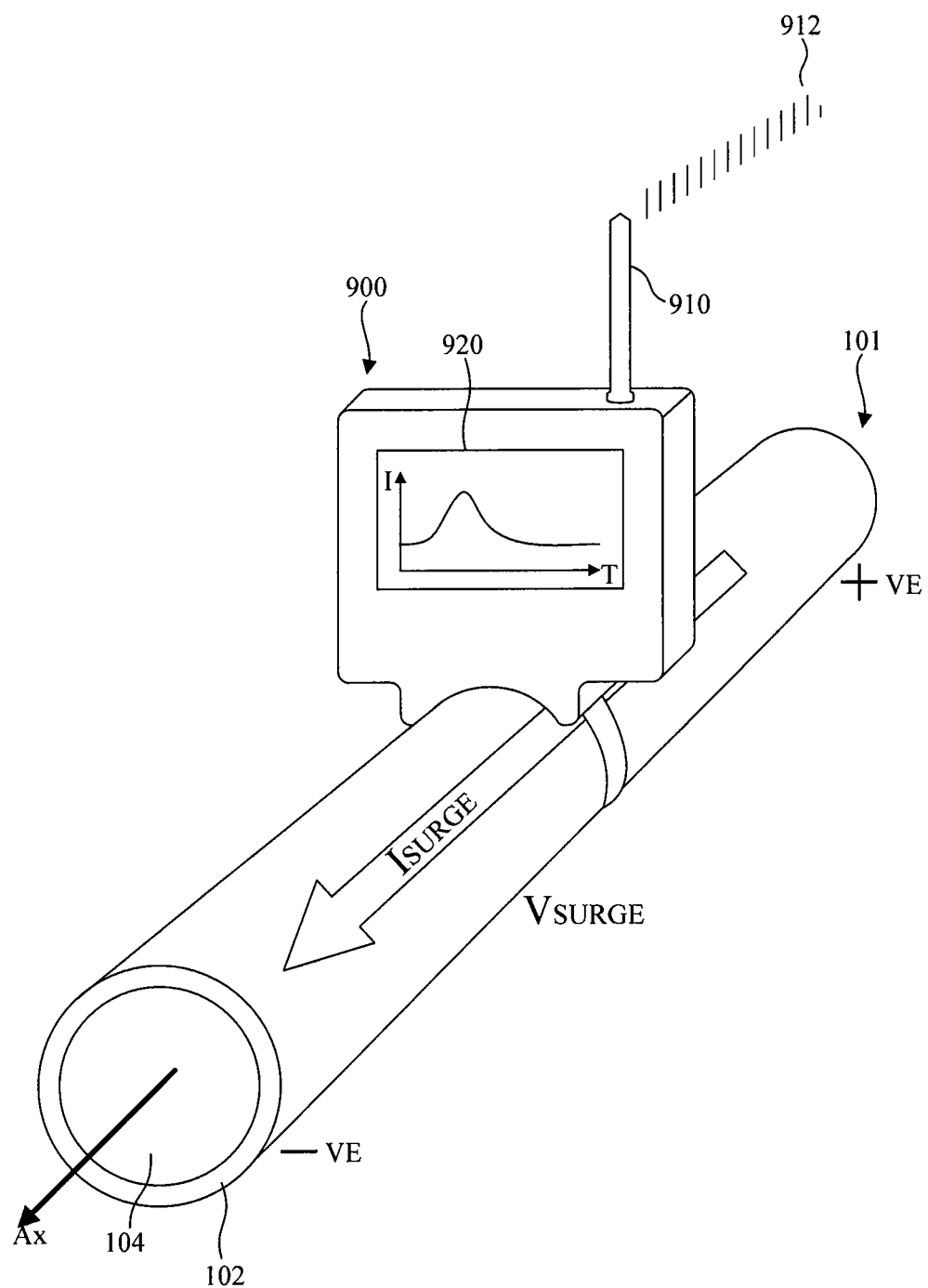
FIG. 9 shows a perspective view of an alternative surge current sensor according to an embodiment of the present invention.

The discussion now turns to various alternative embodiments of the surge current sensors. FIG. 9 shows a perspective view of an alternative surge current sensor 900 according to an embodiment of the present invention. The alternative surge current sensor 900 may incorporate the structural and functional features of the surge current sensors 120, 210, and 300. Additionally, the alternative surge current sensor 900 may include several enhanced capabilities.

In one manner, the alternative surge current sensor 900 may include a display screen 920 for displaying the transient profile of the surge current. In another manner, the alternative surge current sensor 900 may calculate the surge energy of the surge current. In yet another manner, the alternative surge current sensor 900 may include an antenna 910 and a transceiver (not shown) to establish a wireless communications link 912 with a master controller. The alternative surge current sensor 900 may transmit the calculated surge energy to the master controller. When the calculated surge energy exceeds a predetermined surge energy threshold, the alternative surge current sensor 900 may send a request to the master controller for requesting an initiation of a surge protection response.

Figure 10:
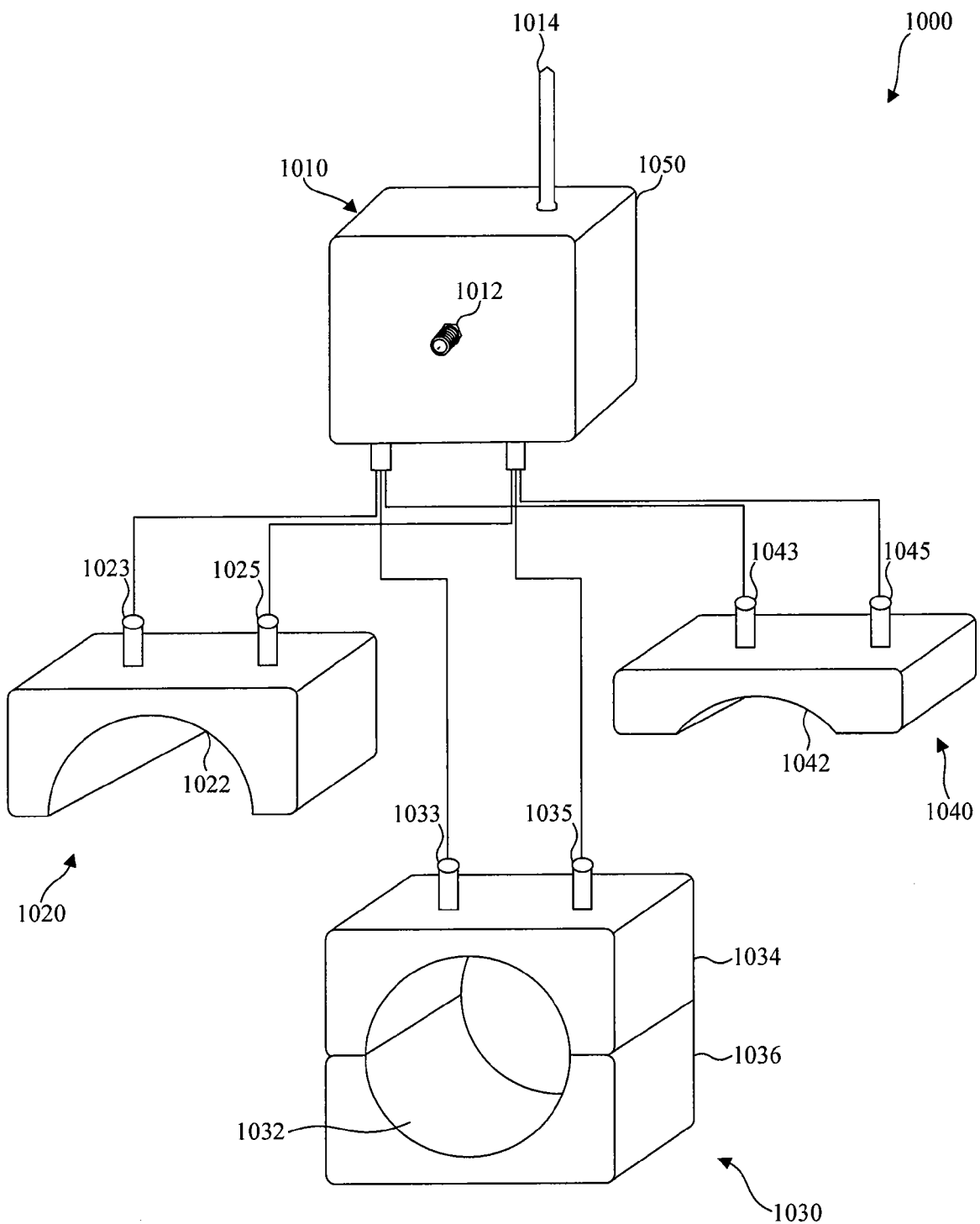
FIG. 10 shows a perspective view of a modulated surge current sensor according to an embodiment of the present invention.

FIG. 10 shows a perspective view of a modulated surge current sensor 1000 according to an embodiment of the present invention. The modulated surge current sensor 1000 may include a signal processing module 1010 and various removable current transformers, such as a medium coverage current transformer 1020, a maximum coverage current transformer 1030, and a minimum coverage current transformer 1040.

The signal processing module 1010 may include a housing 1050, which may be used for enclosing the surge current conversion module 330, the microprocessor module 350, and/or the threshold detection module 360 as shown in FIG. 3. The signal processing module 1010 may include an output port 1012 and an antenna 1014. The output port 1012 may be used for outputting a surge interrupt signal. The antenna 1014 may be used for transmitting a surge current data signal. Depending on the application of the modulated surge current sensor 1000, a user may select and match the signal processing module 1010 with one of the removable current transformers at any single moment of time.

If the modulated surge current sensor 1000 is to be applied to a conduit with a medium diameter, the medium coverage current transformer 1020 may be used. The medium coverage current transformer 1020 may include a semicircular arc surface 1022 for detecting the surge current. In order to deliver the scaled voltage, the medium coverage current transformer 1020 may include a first differential input pin 1023 and a second differential input pin 1025 for plugging into the signal processing module 1050.

If the modulated surge current sensor 1000 is to be applied to a conduit with a small diameter, the maximum coverage current transformer 1030 may be used. The maximum coverage current transformer 1030 may include a circular arc surface 1032 for detecting the surge current. The circular arc surface 1032 may be formed by combining a first transformer block 1034 with a second transformer block 1036. In order to deliver the scaled voltage, the maximum coverage current transformer 1030 may include a first differential input pin 1033 and a second differential input pin 1035 for plugging into the signal processing module 1050.

If the modulated surge current sensor 1000 is to be applied to a conduit with a large diameter, the minimum coverage current transformer 1040 may be selected. The minimum coverage current transformer 1040 may include a small arc surface 1042 for detecting the surge current. In order to deliver the scaled voltage, the minimum coverage current transformer 1040 may include a first differential input pin 1043 and a second differential input pin 1045 for plugging into the signal processing module 1050.

Generally, the surge current conducted by a conduit may be directly proportional to the diameter of the conduit. The scaled voltage is a function of the surge current and the transforming ratio (or scaling ratio) of the surge current transformer. Further, the transforming ratio of the surge current transformer may depend on the coverage of the arc surface, which may be defined by the magnetic core. Because the electronic modules (e.g., the surge current conversion module 330, the microprocessor module 350, and/or the threshold detection module 360) within the surge current sensor may have a fixed operation range, it may be desirable to maintain a relatively stable range of scaled voltage over a wide range of surge current. In order to achieve such stability, the modulated surge current sensor 1000 may provide a flexible solution which allows a user to select the surge current transformer with the appropriate arc surface.

Figure 11:
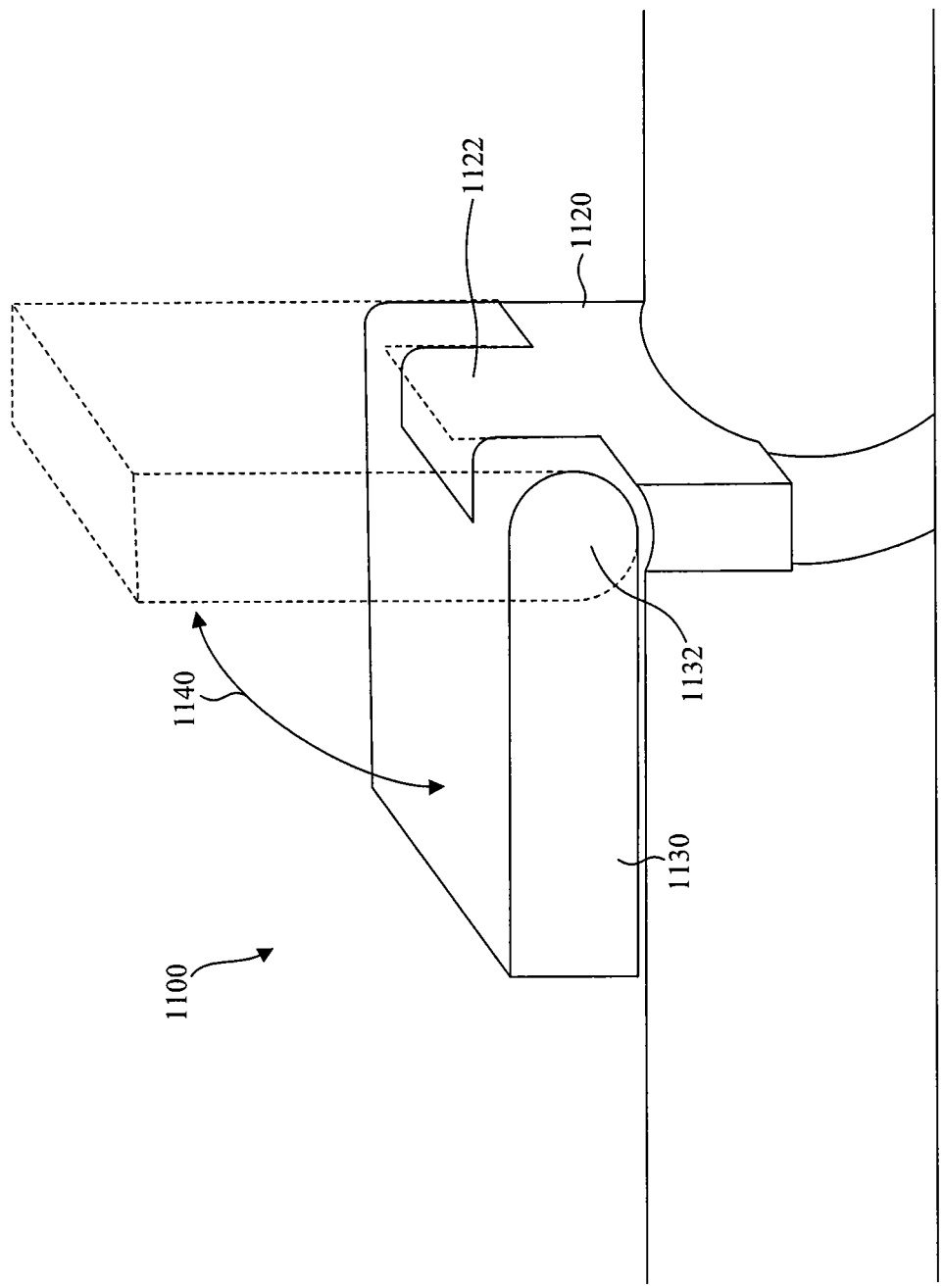
FIG. 11 shows a perspective view of an adjustable surge current sensor according to an embodiment of the present invention.

FIG. 11 shows a perspective view of an adjustable surge current sensor 1100 according to an embodiment of the present invention. The adjustable surge current sensor 1100 may include similar functional features as one or more of the surge current sensors previously discussed in FIGS. 1-10. Additionally, the adjustable surge current sensor 1100 may have a range of flipping motion 1140, which may be enabled by a mechanical joint. Particularly, the surge current transformer 1120 may include a first joint member 1122, and the signal processing module 1130 may include a second joint member 1132. The first joint member 1122 may engage the second joint member 1132 to along a common axle. Accordingly, the second joint member 1132 may have a rotational movement along the common axle and in relative to the first joint member 1122.

Figure 12:
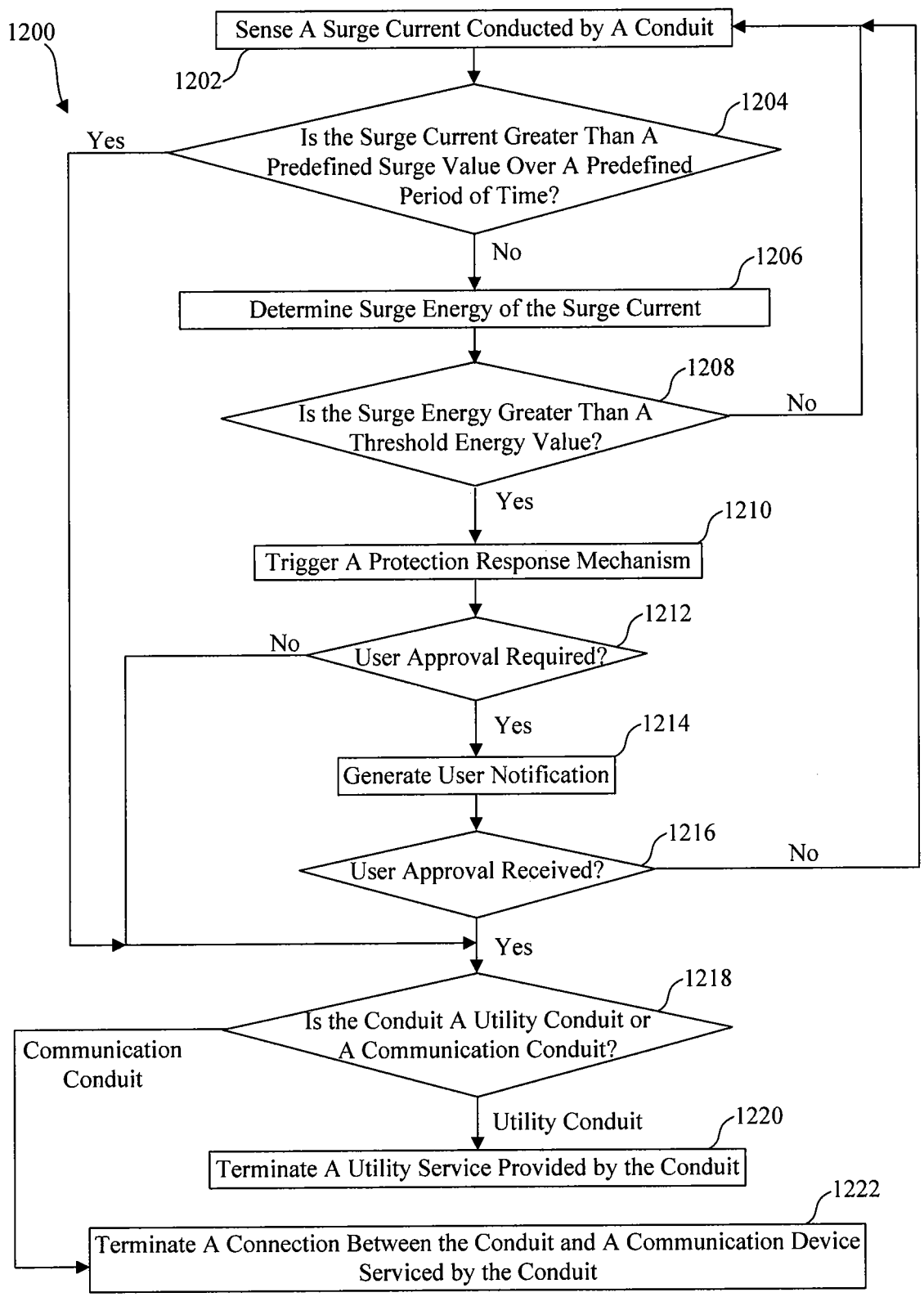
FIG. 12 shows a flow chart of a method for responding to a surge event according to an embodiment of the present invention.

FIG. 12 shows a flow chart of a method 1200 for responding to a surge event according to an embodiment of the present invention. Depending on the overall system design, the method 1200 may be performed by one or more components as discussed in the surge protection systems 700 and 800 as discussed respectively in FIGS. 7 and 8. Optionally, the method 1200 may be encoded and stored as one or more set of computer readable and executable instructions, which may be stored in a non-transitory computer readable medium, such as a CD-ROM, a blue-ray disk, a RAM, a Flash Drive, an EEPROM, a magnetic hard disk, and/or a data server. The method 1200 may include the following method steps.

The method 1200 may begin at step 1202, which may involve sensing a surge current conducted by a conduit. As previously discussed, the conduit may be a utility conduit, a communication conduit, and/or a surge protection conduit. In one embodiment, the surge current may be sensed by using a surge current sensor, which may include any one of the surge current sensors as discussed in FIGS. 1-11. After sensing the surge current, the method 1200 may proceed to step 1204.

In step 1204, a decision may be made regarding whether the surge current is greater than a predefined surge value over a predefined period of time. Generally, the predefined surge value may be related to the predefined period of time. In one embodiment, for example, the predefined surge value may be inversely proportional to the predefined period of time. In other words, the predefined surge value may be much higher if the predefined period of time is much smaller.

If the surge current is greater than the predefined surge value over the predefined period of time, the method 1200 may proceed to step 1218. In step 1218, a decision is made regarding whether the conduit is a utility conduit or a communication conduit. If the conduit is a utility conduit, the method 1200 may proceed to step 1220, which may involve terminating a utility service provided by the conduit. If the conduit is a communication conduit, the method 1200 may proceed to step 1222, which may involve terminating a connection between the conduit and a communication device that is serviced by the conduit.

Referring again to step 1204, if the surge current is not greater than the predefined surge value over the predefined period of time, the method 1200 may proceed to step 1206. In step 1206, surge energy of the surge current may be determined, derived or calculated. In one embodiment, the surge energy of the surge current may be ascertained by using a look-up table. In another embodiment, the surge energy of the surge current may be calculated by using the impedance characteristic of the conduit. For example, assuming that the conduit has an impedance of Z, the surge energy $E_{SURGE}$ from time period T1 to time period T2 may be characterized by:

$$E_{SURGE} = \int_{T1}^{T2} I_{SURGE}(t)^2 Z (dt)$$

After determining the surge energy, the method may proceed to step 1208, in which a decision may be made regarding whether the surge energy is greater than a threshold energy value. The threshold energy value may represent the amount of surge energy that can cause significant damage to the conduit and/or the device that is serviced by the conduit.

If the surge energy is not greater than the threshold energy value, the method 1200 may return to step 1202, in which the surge current may be sensed continuously, iteratively, and/or periodically. On the other hand, if the surge energy is greater than the threshold energy value, the method 1200 may proceed to step 1210, in which a protection response mechanism may be triggered.

After the protection response mechanism is triggered, the method 1200 may proceed to step 1212, in which a decision may be made regarding whether a user approval is required for executing the protection response. If a user approval is not required, the method 1200 may proceed to step 1218, in which a decision is made regarding whether the conduit is a utility conduit or a communication conduit. If the conduit is a utility conduit, the method 1200 may proceed to step 1220, which may involve terminating a utility service provided by the conduit. If the conduit is a communication conduit, the method 1200 may proceed to step 1222, which may involve terminating a connection between the conduit and a communication device that is serviced by the conduit.

Referring again to step 1212, if a user approval is required, the method 1200 may proceed to step 1214. In step 1214, a user notification may be generated. The user notification may include a warning message for informing a user about the magnitude of the surge energy. Moreover, the user notification may include a request message for requesting the user approval.

Next, in step 1216, a decision may be made regarding whether the user approval is received. If the user approval is not received, the method 1200 may return to step 1202. On the other hand, if the user approval is received, the method 1200 may proceed to step 1218. In step 1218, a decision is made regarding whether the conduit is a utility conduit or a communication conduit. If the conduit is a utility conduit, the method 1200 may proceed to step 1220, which may involve terminating a utility service provided by the conduit. If the conduit is a communication conduit, the method 1200 may proceed to step 1222, which may involve terminating a connection between the conduit and a communication device that is serviced by the conduit.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A surge current sensor for placement in proximity of a conduit, comprising:
   a current transformer having an arc surface configured to receive a magnetic flux generated by a surge current in the conduit, the current transformer transforming the received magnetic flux to a voltage;
   a processor coupled to the current transformer, and configured to generate a digital signal based on the voltage, the digital signal representing a surge magnitude of the surge current; and
   a threshold detector coupled to the current transformer, and configured to generate an enable signal for enabling the processor upon detecting that the surge current exceeds a predetermined threshold.

2. The surge current sensor of claim 1, wherein the current transformer includes:
   a magnetic core placed along the arc surface and having a receiving segment, and configured to guide the magnetic flux to flow through the receiving segment.

3. The surge current sensor of claim 2, wherein the current transformer includes:
   a coiled wire having:
      a first end coupled to a first node,
      a second end coupled to a second node, and
      a coiled segment coiling around the receiving segment of the magnetic core and coupled between the first end and the second end, the coiled segment transforming the magnetic flux to a scaled current flowing through the first node and the second node, the scaled current having a scaled magnitude representative of the surge magnitude of the surge current; and
   a shunt component conducting the scaled current and establishing the voltage between the first node and the second node.

4. The surge current sensor of claim 1, further comprising:
   a surge current converter coupled to the current transformer, and configured to convert the voltage to a plurality of digital values, each of the plurality of digital values corresponding to the voltage at or around a discrete time period.

5. The surge current sensor of claim 4, wherein:
   the processor is coupled to the surge current converter, and configured to generate the digital signal including an interrupt signal upon determining that the plurality of digital values are higher than a predefined surge value over a predefined number of corresponding discrete time periods.

6. The surge current sensor of claim 4, wherein:
   the processor is coupled to the surge current converter, and configured to generate the digital signal including a serial output signal carrying the plurality of digital values.

7. The surge current sensor of claim 4, wherein the current converter includes:
   a differential amplifier coupled to the current transformer, and configured to amplify the voltage,
   a low pass filter coupled to the differential amplifier, and configured to filter out a noise component of the amplified voltage, and
   an analog-to-digital converter (ADC) coupled to the low pass filter, and configured to sample the filtered voltage into the plurality of digital values.

8. The surge current sensor of claim 7, wherein the ADC samples the filtered voltage at a sampling rate ranging from about 500 ksps to about 2000 ksps.

9. The surge current sensor of claim 1, wherein the predefined threshold includes:
   a magnitude threshold corresponding to the surge magnitude of the surge current, and
   a rise time threshold corresponding to a rise time of the surge current, the rise time threshold ranges from about 6 ms to about 10 ms.

10. A surge protection system, comprising:
    a surge sensor positioned adjacent to a conduit, and having a current transformer for sensing a surge current of the conduit, a processor for generating a digital signal representing the sensed surge current and a threshold detector coupled to the current transformer for enabling the processor; and a controller in communication with the surge sensor, the controller configured to determine an occurrence of a surge event based on the digital signal and, upon determining the occurrence of the surge event, generate a notification signal for requesting a surge protection response.

11. The surge protection system of claim 10, further comprising:

a surge reactor in communication with the controller, and configured to generate the surge protection response based on the notification signal.

12. The surge protection system of claim 11, wherein:

the surge reactor includes a gas valve controlling a flow of gas within a channel defined by the conduit, and the surge protection response includes terminating the flow of gas within the channel of the conduit.

13. The surge protection system of claim 11, wherein:

the surge reactor includes an electrical switch controlling a flow of electricity in a conductor protected by the conduit, and the surge protection response includes terminating the flow of electricity in the conductor.

14. The surge protection system of claim 11, wherein:

the surge reactor protects a device serviced by the conduit, and the surge protection response includes disconnecting the conduit from the device.

15. The surge protection system of claim 10, wherein:

the surge sensor is configured to generate an interrupt signal when the sensed surge current exceeds a predetermined surge value over a predetermined period of time, and the interrupt signal is for triggering a surge reactor to generate a surge protection response.

16. A method for responding to a surge event, comprising the steps of:

sensing, with a surge sensor, a surge current conducted by a conduit;

determining a surge energy carried by the surge current;

enabling an interrupt mode of a processor of the surge sensor when the surge energy exceeds a predetermined value; and triggering a protection response when the interrupt mode is enabled.

17. The method of claim 16, wherein the protection response includes terminating a flow of gas within a channel defined by the conduit.

18. The method of claim 16, wherein the protection response includes terminating a flow of electricity in a conductor protected by the conduit.

19. The method of claim 16, wherein the protection response includes disconnecting the conduit from a device serviced by the conduit.

* * * * *